US011502144B2

(12) United States Patent
Cho et al.

(10) Patent No.: US 11,502,144 B2
(45) Date of Patent: Nov. 15, 2022

(54) DISPLAY DEVICE HAVING TAPERED PARTITION WALL AND METHOD OF MANUFACTURING THE SAME

(71) Applicant: Samsung Display Co., Ltd., Yongin-si (KR)

(72) Inventors: Hyun Min Cho, Hwaseong-si (KR); Tae Wook Kang, Seongnam-si (KR); Tae Sung Kim, Incheon (KR); Dae Won Choi, Cheonan-si (KR); Sang Gab Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 238 days.

(21) Appl. No.: 16/838,956

(22) Filed: Apr. 2, 2020

(65) Prior Publication Data

US 2021/0036073 A1 Feb. 4, 2021

(30) Foreign Application Priority Data

Jul. 31, 2019 (KR) .................. 10-2019-0093421

(51) Int. Cl.
*H01L 27/32* (2006.01)
*H01L 51/52* (2006.01)

(52) U.S. Cl.
CPC ........ *H01L 27/3246* (2013.01); *H01L 27/322* (2013.01); *H01L 27/3258* (2013.01); *H01L 27/3272* (2013.01); *H01L 51/5228* (2013.01); *H01L 2227/323* (2013.01)

(58) Field of Classification Search
None
See application file for complete search history.

(56) References Cited

U.S. PATENT DOCUMENTS

| 10,056,441 | B2 | 8/2018 | Jang et al. | |
| 2014/0183501 | A1* | 7/2014 | Kim | H01L 51/56 438/34 |
| 2017/0186831 | A1* | 6/2017 | Nam | H01L 27/3272 |
| 2018/0180772 | A1* | 6/2018 | Ji | H01L 27/322 |
| 2019/0131365 | A1* | 5/2019 | Jung | H01L 27/3246 |
| 2020/0343315 | A1* | 10/2020 | Lin | H01L 27/3246 |

FOREIGN PATENT DOCUMENTS

| KR | 10-2009-0004672 A | 1/2009 |
| KR | 10-2010-0025804 A | 3/2010 |
| KR | 10-2014-0085326 A | 7/2014 |
| KR | 10-2017-0072726 A | 6/2017 |
| KR | 10-2018-0069981 A | 6/2018 |

* cited by examiner

*Primary Examiner* — Nduka E Ojeh
(74) *Attorney, Agent, or Firm* — Lewis Roca Rothgerber Christie LLP

(57) ABSTRACT

A display device includes a first base, a pixel electrode on the first base, a pixel defining layer having an opening that at least partially exposes the pixel electrode, a light emitting layer on the pixel electrode, an auxiliary electrode on the same layer as the pixel electrode, a partition wall on the auxiliary electrode that at least partially exposes a side surface of the auxiliary electrode, an organic layer on the partition wall, and a common electrode continuously arranged on the light emitting layer and the organic layer, wherein a side surface of the partition wall has a reverse-tapered shape, and the common electrode contacts the side surface of the auxiliary electrode.

19 Claims, 18 Drawing Sheets

DISPLAY DEVICE HAVING TAPERED PARTITION WALL AND METHOD OF MANUFACTURING THE SAME

CROSS-REFERENCE TO RELATED APPLICATION

This application claims priority to and the benefit of Korean Patent No. 10-2019-0093421, filed on Jul. 31, 2019, in the Korean Intellectual Property Office, the disclosure of which is incorporated herein by reference in its entirety.

BACKGROUND

1. Field

The present disclosure relates to a display device and a method of manufacturing the same.

2. Description of the Related Art

With the development of multimedia, display devices are becoming more important. Accordingly, various display devices such as liquid crystal display devices (LCDs), organic light emitting diode display devices (OLEDs), and the like are being developed.

Among these display devices, the OLEDs include organic light emitting devices (or organic light emitting diodes) which are self-luminous devices. The organic light emitting device may include two opposing electrodes and an organic light emitting layer interposed therebetween. Electrons and holes provided from the two electrodes are recombined in the light emitting layer to generate excitons, and the generated excitons are transitioned from an excited state to a ground state such that light may be emitted.

Because a separate light source is not required, the OLEDs may be formed not only to have low power consumption and to be thin and lightweight, but also to have high quality characteristics such as a wide viewing angle, high brightness and contrast, a fast response speed, and the like. Consequently, the OLEDs are attracting attention as next generation display devices.

SUMMARY

Aspects of embodiments of the present disclosure provide a display device that is capable of minimizing a voltage drop, or reducing the likelihood of a voltage drop.

Aspects of embodiments of the present disclosure also provide a method of manufacturing a display device, which is capable of minimizing a voltage drop of a display device and, at the same time, securing economic feasibility of a process.

According to an aspect of embodiments of the present disclosure, a display device includes a first base, a pixel electrode on the first base, a pixel defining layer having an opening that at least partially exposes the pixel electrode, a light emitting layer on the pixel electrode, an auxiliary electrode at a same layer as the pixel electrode, a partition wall on the auxiliary electrode and at least partially exposing a side surface of the auxiliary electrode, an organic layer on the partition wall, and a common electrode continuously arranged on the light emitting layer and the organic layer, wherein a side surface of the partition wall has a reverse-tapered shape, and wherein the common electrode contacts the side surface of the auxiliary electrode.

In an exemplary embodiment, a first tapered angle between the side surface of the partition wall and an upper surface of the auxiliary electrode may be greater than a second tapered angle between the pixel defining layer and an upper surface of the pixel electrode.

In an exemplary embodiment, the side surface of the partition wall may contact the common electrode.

In an exemplary embodiment, the display device may include a compensation electrode electrically connected to the auxiliary electrode.

In an exemplary embodiment, the display device may further include a source electrode or a drain electrode located between the first base and the pixel electrode, the pixel electrode may be electrically connected to the source electrode or the drain electrode, and the compensation electrode may be at a same layer as the source electrode or the drain electrode.

In an exemplary embodiment, the common electrode may be electrically connected to the compensation electrode.

In an exemplary embodiment, a lower surface of the partition wall may contact the auxiliary electrode, and an upper surface of the partition wall may contact the organic layer.

In an exemplary embodiment, the partition wall and the pixel defining layer may be made of the same material.

In an exemplary embodiment, the partition wall and the pixel defining layer may include SiNx, SiOx, or SiON.

In an exemplary embodiment, the partition wall may include a conductive material.

In an exemplary embodiment, a lower surface of the organic layer may contact the partition wall, and an upper surface of the organic layer may contact the common electrode.

In an exemplary embodiment, the organic layer and the light emitting layer may be made of the same material.

In an exemplary embodiment, the organic layer may be spaced apart from the light emitting layer.

In an exemplary embodiment, the display device may further include a wavelength conversion pattern and a light transmission pattern on the common electrode, and the wavelength conversion pattern or the light transmission pattern may overlap the opening of the pixel defining layer in a thickness direction.

According to another aspect of embodiments of the present disclosure, a display device includes a first base, a pixel electrode on the first base, a pixel defining layer having an opening that at least partially exposes the pixel electrode, a light emitting layer on the pixel electrode, an auxiliary electrode on the same layer as the pixel electrode, a conductive partition wall at the auxiliary electrode and including a first metal layer on the auxiliary electrode and a second metal layer on the first metal layer, an organic layer on the conductive partition wall, and a common electrode continuously arranged on the light emitting layer and the organic layer, wherein an end portion of the second metal layer protrudes further than an end portion of an upper surface of the first metal layer, and wherein the common electrode contacts a side surface of the first metal layer.

In an exemplary embodiment, the auxiliary electrode may be electrically connected to the common electrode.

In an exemplary embodiment, a lower surface of the first metal layer may contact the auxiliary electrode, and the upper surface of the first metal layer may contact the second metal layer.

In an exemplary embodiment, a width of the lower surface of the first metal layer in a first direction may be greater than a width of the upper surface of the first metal layer in the first direction.

In an exemplary embodiment, a thickness of the first metal layer in a third direction may be greater than a thickness of the second metal layer in the third direction.

According to another aspect of embodiments of the present disclosure, a method of manufacturing a display device includes providing a first base, forming a pixel electrode and an auxiliary electrode on the first base concurrently, forming an inorganic layer on the pixel electrode and the auxiliary electrode, etching the inorganic layer and forming a pixel defining layer having an opening that at least partially exposes the pixel electrode, over-etching the inorganic layer and forming a partition wall that at least partially exposes a side surface of the auxiliary electrode, forming a light emitting layer on the pixel defining layer and forming an organic layer on the partition wall, and forming a common electrode on the pixel defining layer, the partition wall, and the side surface of the auxiliary electrode.

In an exemplary embodiment, the forming of the pixel defining layer and the forming of the partition wall may be concurrently performed.

In an exemplary embodiment, the forming of the pixel defining layer may include forming first photoresists on the inorganic layer so as to overlap the pixel electrode and forming a second photoresist between the first photoresists on the inorganic layer, the forming of the partition wall may include forming a third photoresist on the inorganic layer so as to overlap the auxiliary electrode, and a thickness of the third photoresist in a thickness direction may be less than a thickness of the first photoresist in the thickness direction.

In an exemplary embodiment, the method may further include, between the providing of the first base and the forming of the pixel electrode and the auxiliary electrode, concurrently forming a source electrode, a drain electrode, and a compensation electrode.

In an exemplary embodiment, the forming of the pixel electrode and the auxiliary electrode may include forming the source electrode or the drain electrode to be in contact with the pixel electrode and forming the compensation electrode to be in contact with the auxiliary electrode.

BRIEF DESCRIPTION OF THE DRAWINGS

The above and other aspects and features of the present disclosure will become more apparent by describing exemplary embodiments thereof, with reference to the attached drawings, in which.

DETAILED DESCRIPTION

Figure 1:
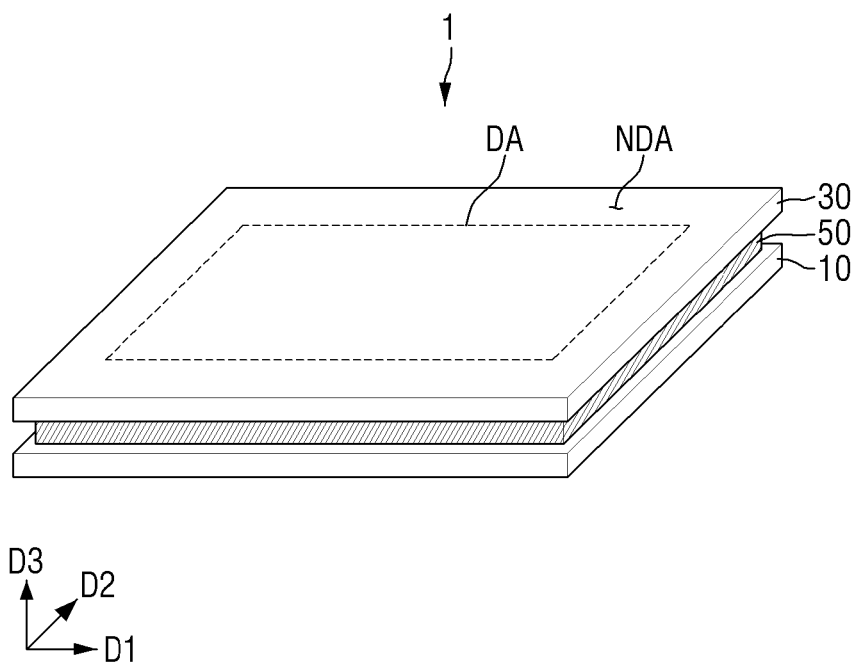
FIG. 1 is a perspective view illustrating a display device according to an example embodiment of the present disclosure.

The present disclosure will now be described more fully hereinafter with reference to the accompanying drawings, in which exemplary embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on," "connected to," or "coupled to" another layer, element, or substrate, it can be directly on the other layer, element, or substrate, or one or more intervening layers may also be present. In addition, it will also be understood that when an element or layer is referred to as being "between" two elements or layers, it can be the only element or layer between the two elements or layers, or one or more intervening elements or layers may also be present. The same reference numbers indicate the same components throughout the specification. In the drawings, the relative sizes of elements, layers, and regions may be exaggerated for clarity.

It will be understood that, although the terms "first," "second," "third," etc., may be used herein to describe various elements, components, regions, layers, and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the terms "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." In addition, the use of alternative language, such as "or," when describing embodiments of the present disclosure, refers to "one or more embodiments of the present disclosure" for each corresponding item listed. As used herein, the terms "use," "using," and "used" may be considered synonymous with the terms "utilize," "utilizing," and "utilized," respectively. Also, the term "exemplary" is intended to refer to an example or illustration. Further, as used herein, a "plan view" or a "planar view" may refer to a top-down view, or a view from a direction normal to the display surface of the display panel.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, example embodiments of the present disclosure are described with reference to the accompanying drawings.

Figure 2:
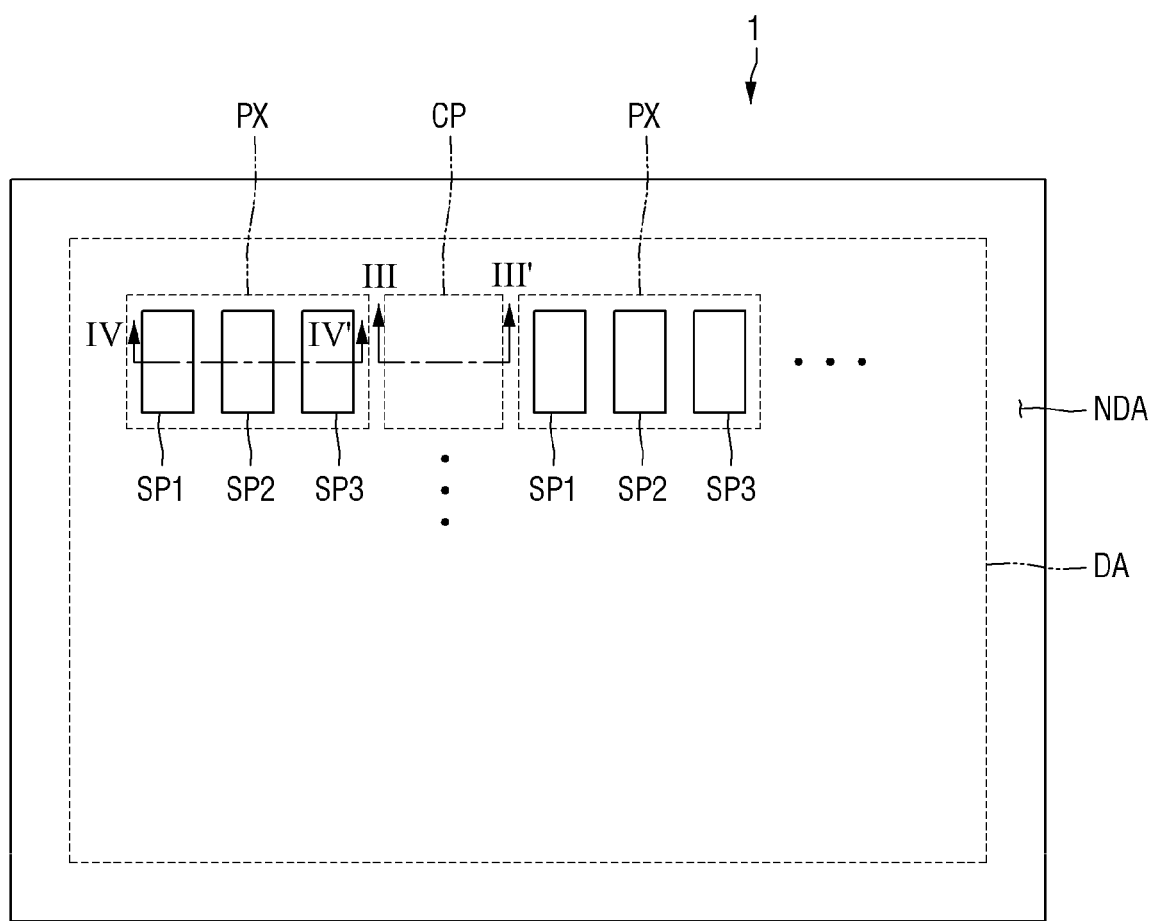
FIG. 2 is a plan view of the display device of FIG. 1.
Figure 2:
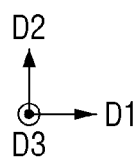
Figure 3:
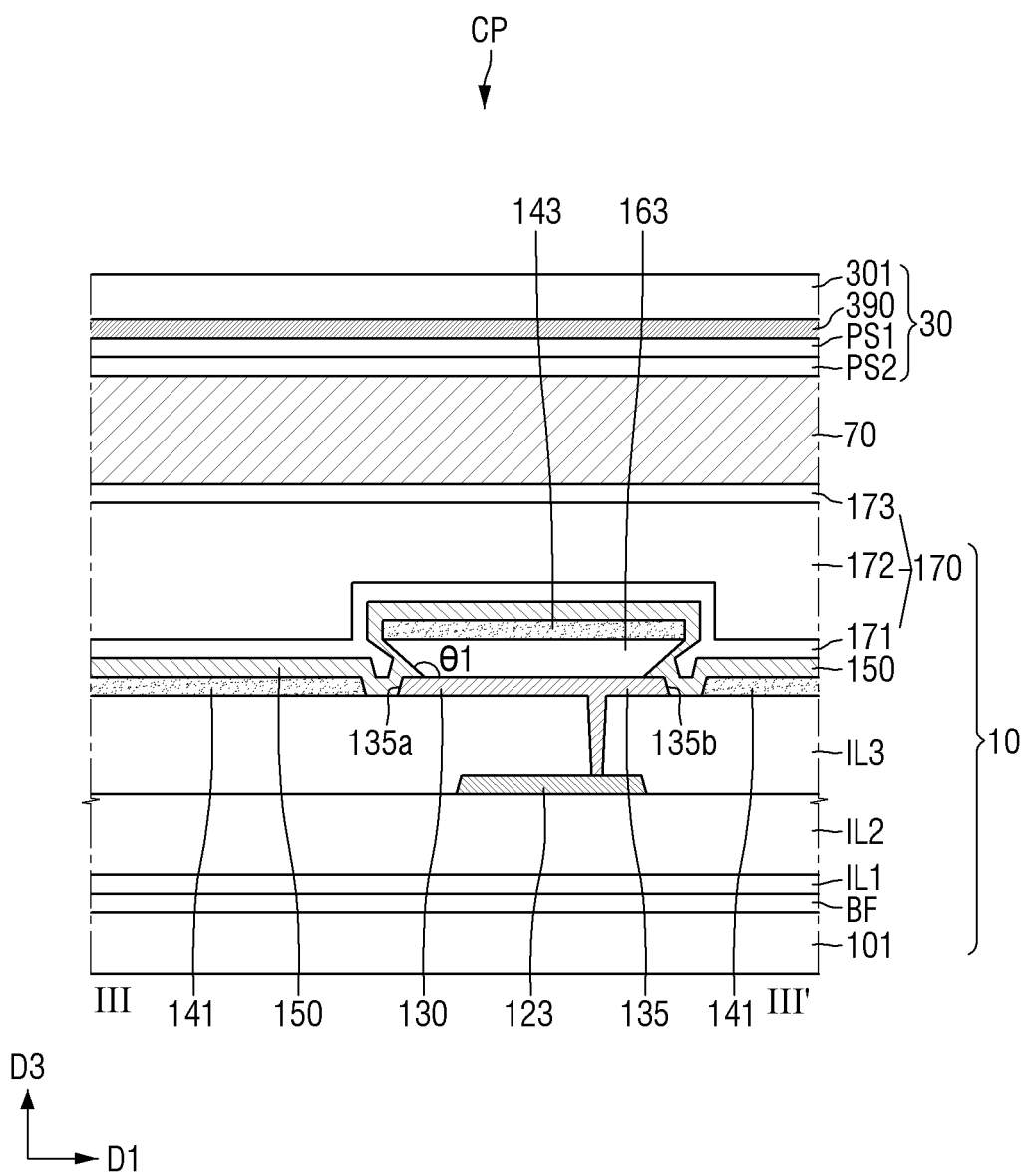
FIG. 3 is a cross-sectional view taken along the line III-III' of FIG. 2.
Figure 4:
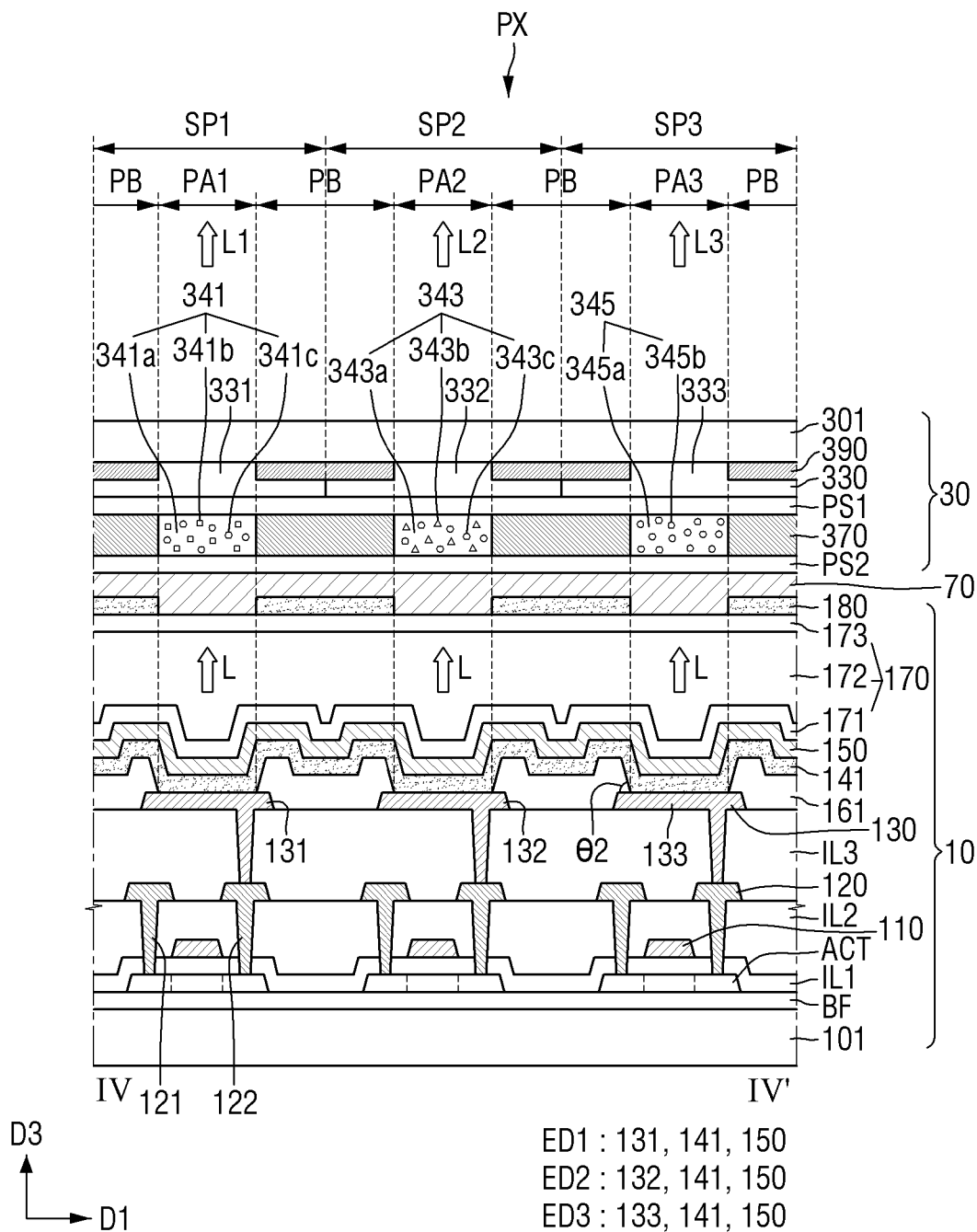
FIG. 4 is a cross-sectional view taken along the line IV-IV' of FIG. 2.

FIG. 1 is a perspective view illustrating a display device according to an example embodiment of the present disclosure. FIG. 2 is a plan view of the display device of FIG. 1. FIG. 3 is a cross-sectional view taken along the line III-III' of FIG. 2. FIG. 4 is a cross-sectional view taken along the line IV-IV' of FIG. 2.

Referring to FIG. 1, a display device 1 may be applied to various electronic devices, such as small-to-medium electronic devices, such as tablet personal computers (PCs), smartphones, car navigation units, cameras, center information displays (CIDs) provided in vehicles, wristwatch type electronic devices, personal digital assistants (PDAs), portable multimedia players (PMPs), game machines, and the like, and medium-to-large electronic devices, such as televisions, external billboards, monitors, PCs, notebook computers, and the like. The above description is merely presented as an example, and, alternatively, the display device 1 may be employed in other suitable electronic devices without departing from the concept of the present disclosure.

The display device 1 may be formed in a rectangular shape when viewed in a plan view. The display device 1 may include two long sides extending in one direction (e.g., a first direction D1) and two short sides extending in another direction (e.g., a second direction D2) intersecting the first direction D1. When viewed in a plan view, a corner at which the long side and the short side of the display device 1 meet may be a right angle, but the present disclosure is not limited thereto, and the corner may have a rounded curved shape, for example. A planar shape of the display device 1 is not limited to that illustrated in FIG. 1, and the display device 1 may have a square shape, a circular shape, an elliptical shape, or any other suitable shape.

The display device 1 may include a display area DA, in which an image is displayed (or which is configured to display an image), and a non-display area NDA which is disposed outside the display area DA and in which the image is not displayed (or which is not configured to display an image). The display area DA may be disposed in a central portion of the display device 1, but the present disclosure is not limited thereto. For example, the display area DA may be disposed in an edge area of the display device 1.

The display device 1 may include a first substrate 10, a second substrate 30 facing the first substrate 10, and a sealing member 50 that bonds the first substrate 10 to the second substrate 30 at edges (or a periphery) of the first substrate 10 and the second substrate 30.

The first substrate 10 may include elements and circuits for displaying an image, e.g., pixel circuits, such as switching elements and the like, a pixel defining layer, which defines a light emission area and a non-light emission area of the display area DA, and an organic light emitting device. The first substrate 10 may be a display substrate.

The second substrate 30 is disposed above the first substrate 10 and faces the first substrate 10. The second substrate 30 may be a color conversion substrate, which includes a color conversion pattern for converting a color of incident light, but the present disclosure is not limited thereto.

In the non-display area NDA, the sealing member 50 may be disposed between the first substrate 10 and the second substrate 30. The sealing member 50 may be disposed along the edges (or the periphery) of the first substrate 10 and the second substrate 30 in the non-display area NDA to surround the display area DA when viewed in a plan view. The first substrate 10 may be coupled to the second substrate 30 via the sealing member 50. The sealing member 50 may include an organic material, such as an epoxy-based resin, but the present disclosure is not limited thereto.

Referring now to FIG. 3, a filling layer 70, which is surrounded by the sealing member 50, may be further disposed in a space between the first substrate 10 and the second substrate 30. The filling layer 70 may fill a space between the first substrate 10 and the second substrate 30. The filling layer 70 is described in further detail below with reference to FIG. 3.

Referring to FIG. 2, the display area DA of the display device 1 may include a plurality of pixels PX and a compensation part CP.

The compensation part CP may serve to improve brightness uniformity of the plurality of pixels PX by reducing or minimizing a voltage drop (IR drop), which is caused by high electrical resistance of a common electrode 150, which will be described further below.

The compensation part CP may be between (or disposed between) the plurality of pixels PX. The compensation part CP is illustrated in FIG. 2 as being disposed between the plurality of pixels PX along the first direction D1, but the arrangement of the plurality of pixels PX and the compensation part CP is not limited thereto. For example, the compensation part CP may be disposed between the plurality of pixels PX along the second direction D2 or may be partially disposed on one side or the other side of the plurality of pixels PX. Further, the compensation part CP may partially overlap the plurality of pixels PX.

Referring to FIGS. 3 and 4, the first substrate 10 of the compensation part CP may include a first base 101, a buffer layer BF, a first insulating layer IL1, a second insulating layer IL2, a second conductive layer 120, a third insulating layer IL3, a first electrode 130, a partition wall 163, an organic layer 143, and a common electrode 150.

Each of the above-described layers may be formed of a single layer or may also be formed of stacked layers including a plurality of layers. One or more other layers may be further disposed between the above-described layers.

The first base 101 may be made of a material having light transmittance. The first base 101 may be a glass substrate or a plastic substrate, for example. When the first base 101 is a plastic substrate, the first base 101 may have flexibility.

The buffer layer BF is on (or disposed on) the first base 101. The buffer layer BF may generally be on (or disposed on) an entire surface of the first base 101 (or on a surface of the first base 101 in its entirety). The buffer layer BF may prevent diffusion of impurity ions and water infiltration, or reduce the likelihood of diffusion of impurity ions and water infiltration, and may perform a surface planarization function (or may planarize a surface prior to disposing additional layer(s)). The buffer layer BF may include silicon nitride, silicon oxide, silicon oxynitride, or the like.

The first insulating layer IL1 is on (or disposed on) the buffer layer BF. The first insulating layer IL1 may generally be disposed on an entire surface of the buffer layer BF (or on a surface of the buffer layer BF in its entirety). The first insulating layer IL1 may be a gate insulating layer having a gate insulating function. The first insulating layer IL1 may include a silicon compound, a metal oxide, or the like. For example, the first insulating layer IL1 may include one or more of silicon oxide, silicon nitride, silicon oxynitride, aluminum oxide, tantalum oxide, hafnium oxide, zirconium oxide, titanium oxide, or the like. The first insulating layer IL1 may be a single layer or a multilayer layer made of stacked layers of different materials.

The second insulating layer IL2 is on (or disposed on) the first insulating layer IL1. The second insulating layer IL2 may be disposed over (or above) the entire surface of the first base 101 (or may be over the surface of the first base 101 in its entirety). The second insulating layer IL2 serves to insulate a first conductive layer 110 from the second conductive layer 120, which is described further below.

The second insulating layer IL2 may be an interlayer insulating layer. The second insulating layer IL2 may include the same material as the above-described first insulating layer IL1, or may include one or more materials selected from among the materials which are exemplified as constituent materials of the first insulating layer IL1.

The second conductive layer 120 is on (or disposed on) the second insulating layer IL2 (see, e.g., FIG. 4). The second conductive layer 120 may be a single layer or may have a multilayer structure. For example, the second conductive layer 120 may be formed in a stacked structure of Ti/Al/Ti, Mo/Al/Mo, Mo/AlGe/Mo, Ti/Cu, or the like.

The second conductive layer 120 may include a compensation electrode 123. The compensation electrode 123 may be electrically connected to the common electrode 150, which is described further below, and may serve to compensate for a voltage drop of the common electrode 150 to improve brightness uniformity.

The compensation electrode 123 may be made of a low resistance material so as to reduce a voltage drop due to thickness reduction, resulting from high electrical resistance of the common electrode 150, which is described further below.

The compensation electrode 123 may include one or more metals selected from among aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The third insulating layer IL3 covers the second conductive layer 120. The third insulating layer IL3 may be a via layer. The third insulating layer IL3 may include an organic insulating material such as an acrylic-based resin (polyacrylate resin), an epoxy resin, a phenolic resin, a polyimide-based resin, a polyimide-based resin, an unsaturated polyester-based resin, a polyphenylene-based resin, a polyphenylene sulfide-based resin, and/or benzocyclobutene (BCB).

The first electrode 130 may be on (or disposed on) the third insulating layer IL3. The first electrode 130 may include a material having a high work function which facilitates hole injection, such as indium-tin-oxide (ITO), indium-zinc-oxide (IZO), zinc oxide (ZnO), indium oxide ($In_2O_3$), or the like.

The first electrode 130 may include an auxiliary electrode 135. The auxiliary electrode 135 may serve to connect the common electrode 150, described further below, to the compensation electrode 123.

The auxiliary electrode 135 may be connected to the compensation electrode 123 through an opening (e.g., a contact hole) passing through the third insulating layer IL3. The auxiliary electrode 135 may overlap the compensation electrode 123 in a thickness direction (e.g., a third direction D3).

The partition wall 163 may be on (or disposed on) the first electrode 130. A lower surface of the partition wall 163 may be in direct contact with an upper surface of the auxiliary electrode 135, and an upper surface of the partition wall 163 may be in direct contact with a lower surface of the organic layer 143.

A cross-sectional shape of the partition wall 163 may have a reverse-tapered shape (or a trapezoid-shape). For example, a side surface of the partition wall 163 may have a reverse-tapered shape. A first tapered angle θ1 between the side surface of the partition wall 163 and the upper surface of the auxiliary electrode 135 may be in a range from about 100° to about 150°. Alternatively, the first tapered angle θ1 may be in a range from about 110° to about 130°, but the present disclosure is not limited thereto.

A width (e.g., a width along the first direction D1) of the upper surface of the partition wall 163 may be greater than that of the lower surface of the partition wall 163. The lower surface of the partition wall 163 may be defined as a surface in contact with the auxiliary electrode 135, and the upper surface of the partition wall 163 may be defined as a surface opposite the lower surface of the partition wall 163.

The width (e.g., along the first direction D1) of the lower surface of the partition wall 163 may be smaller than that of the upper surface of the auxiliary electrode 135. Also, the width of the upper surface of the partition wall 163 may be greater than that of the upper surface of the auxiliary electrode 135. As such, a side surface of the auxiliary electrode 135 may be exposed due to the lower surface of the partition wall 163 and covered by the upper surface of the partition wall 163 (e.g., may be covered by the upper surface of the partition wall 163 in a plan view).

Specifically, the lower surface of the partition wall 163 may expose both of a first side surface 135a, which is disposed on one side (e.g., a first side) of the upper surface of the auxiliary electrode 135, and a second side surface 135b which is disposed on the other side (e.g., a second side) of the upper surface of the auxiliary electrode 135. The first side surface 135a and the second side surface 135b of the auxiliary electrode 135, which are exposed due to the partition wall 163, may be in direct contact with the common electrode 150, described further below. Accordingly, a voltage drop due to a reduction in thickness of the common electrode 150 may be minimized, or reduced.

Further, the first side surface 135a and the second side surface 135b of the auxiliary electrode 135 may overlap the upper surface of the partition wall 163 in the thickness direction (e.g., the third direction D3), thereby being covered by the upper surface of the partition wall 163. Accordingly, even when the organic layer 143 or a light emitting layer 141 is formed over the first base 101, the organic layer 143 or the light emitting layer 141 are not disposed on the first side surface 135a and the second side surface 135b of the auxiliary electrode 135. Consequently, it is possible to secure contacts between the first and second side surfaces 135a and 135b of the auxiliary electrode 135 and the common electrode 150, described further below.

The partition wall 163 may be made of an inorganic material. The inorganic material may include silicon oxide ($SiO_x$), silicon nitride ($SiN_x$), and/or silicon oxynitride ($SiON_x$).

The partition wall 163 may include the same material as a pixel defining layer 161, described further below. Further, the partition wall 163 may be simultaneously (or concurrently) formed with the pixel defining layer 161, described further below.

The organic layer 143 may be on (or disposed on) the partition wall 163. The lower surface of the organic layer 143 may be in direct contact with the upper surface of the partition wall 163, and an upper surface of the organic layer 143 may be in direct contact with the common electrode 150.

The organic layer 143 may include a light emitting material, but may be a non-light emission layer in which light emission does not substantially occur. The organic layer 143 and the light emitting layer 141, described further below, may include the same material and may have the same stacked structure. The organic layer 143 may include a hole transport layer, a light emitting material layer, an electron transport layer, and the like. Further, the organic layer 143 may be simultaneously (or concurrently) formed with the light emitting layer 141, as described further below with reference to FIGS. 4-7.

In general, a material used as the organic layer 143 may have low step coverage. Therefore, when the partition wall 163 is formed in a reverse-tapered shape, the organic layer 143 may be partially disposed on only the upper surface of the partition wall 163 and may not be disposed on the side surface of the partition wall 163. For example, the organic layer 143 may not be in contact with the side surface of the partition wall 163.

Further, as described above, the first side surface 135a and the second side surface 135b of the auxiliary electrode 135 may overlap the upper surface of the partition wall 163 in the thickness direction, thereby being covered by the upper surface of the partition wall 163. Thus, the organic layer 143 may not be substantially disposed on the first side surface 135a and the second side surface 135b of the auxiliary electrode 135. For example, the organic layer 143 may not be in contact with the first side surface 135a and the second side surface 135b of the auxiliary electrode 135. Consequently, as described above, it is possible to secure the contacts between the first and second side surfaces 135a and 135b of the auxiliary electrode 135 and the common electrode 150, as described further below.

The organic layer 143 is a common layer which is simultaneously (or concurrently) formed with the light emitting layer 141. However, the organic layer 143 is spaced apart from the light emitting layer 141 due to a step by the partition wall 163 such that the organic layer 143 may not be in contact with the light emitting layer 141.

The common electrode 150 may be on (or disposed on) the organic layer 143. The common electrode 150 may be a common layer formed over the first base 101. A lower surface of the common electrode 150 may be in direct contact with the organic layer 143, the side surface of the partition wall 163, and the auxiliary electrode 135, and an upper surface of the common electrode 150 may be in direct contact with a first inorganic encapsulation layer 171.

The common electrode 150 may have semi-transmittance or transmittance. The common electrode 150 may include a material having a low work function for easy electron injection, e.g., Li, Ca, LiF/Ca, LiF/Al, Al, Mg, Ag, Pt, Pd, Ni, Au, Nd, Ir, Cr, BaF, Ba, or a compound or a mixture thereof (e.g., a mixture of Ag and Mg). The common electrode 150 may further include a transparent conductive oxide which is disposed on a material layer having a low work function. For example, the common electrode 150 may include a transparent conductive oxide such as ITO, IZO, indium tin zinc oxide (ITZO), ZnO, tin oxide, or the like.

In order to increase light transmittance of the common electrode 150, the common electrode 150 may be formed with a relatively small (or very thin) thickness. Owing to the reduction in thickness of the common electrode 150, electrical resistance of the common electrode 150 may be increased to cause a voltage drop of the display device 1. For example, brightness of the central portion of the display device 1 may be degraded, and a phenomenon of the voltage drop may be severe as the display device 1 has a large area. Therefore, in the display device 1 according to an embodiment of the present disclosure, the common electrode 150 is electrically connected to the compensation electrode 123 so that the voltage drop due to the reduction in thickness of the common electrode 150 may be minimized, or reduced.

Specifically, because the common electrode 150 has higher step coverage than the organic layer 143, even when the partition wall 163 is formed in a reverse-tapered shape, the common electrode 150 may be deposited on one surface of a structure under the partition wall 163. For example, the common electrode 150 may be disposed to cover one surface of each of the auxiliary electrode 135, the partition wall 163, and the organic layer 143. That is, the common electrode 150 may be connected on the auxiliary electrode 135, the partition wall 163, and the organic layer 143 without disconnection.

The common electrode 150 may be disposed on the side surface of the partition wall 163. That is, the common electrode 150 may be in direct contact with the side surface of the partition wall 163. Further, the common electrode 150 may be disposed on the first side surface 135a and the second side surface 135b of the auxiliary electrode 135, which are exposed due to the partition wall 163. That is, the common electrode 150 may be in direct contact with the first side surface 135a and the second side surface 135b of the auxiliary electrode 135. The common electrode 150 may be electrically connected to the compensation electrode 123 through the auxiliary electrode 135. Accordingly, even when the thickness of the common electrode 150 is formed to be small (or thin), the voltage drop may be reduced or minimized due to the compensation electrode 123, such that degradation in brightness of the display device 1 may be prevented, or the likelihood thereof may be reduced.

A thin film encapsulation layer 170 is on (or disposed on) the common electrode 150. The thin film encapsulation layer 170 may be a common layer which is formed over the common electrode 150. The thin film encapsulation layer 170 may directly cover the common electrode 150. The thin film encapsulation layer 170 may include the first inorganic encapsulation layer 171, an organic encapsulation layer 172, and a second inorganic encapsulation layer 173, which are sequentially stacked on the common electrode 150.

Each of the first inorganic encapsulation layer 171 and the second inorganic encapsulation layer 173 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like.

The organic encapsulation layer 172 may be made of an acrylic-based resin, a methacrylic-based resin, polyisoprene, a vinyl-based resin, an epoxy-based resin, a urethane-based resin, a cellulose-based resin, a perylene-based resin, or the like.

However, the structure of the thin film encapsulation layer 170 is not limited to the above-described examples, and a stacked structure of the thin film encapsulation layer 170 may be variously modified.

The second substrate 30 may be disposed above the first substrate 10.

The second substrate 30 may include a second base 301, a light blocking layer 390, a first capping layer PS1, and a second capping layer PS2.

The second base 301 may be made of a material having light transmittance. The second base 301 may include a glass substrate or a plastic substrate. The second base 301 may further include a separate layer, which is disposed on a glass substrate or a plastic substrate, e.g., an insulating layer, such as an inorganic layer or the like.

The light blocking layer 390 may be on (or disposed on) one surface of the second base 301 facing the first substrate 10, e.g., on a lower surface of the second base 301. The light blocking layer 390 may include an organic light blocking material and may be formed through a process of coating and exposing the organic light blocking material. The light blocking layer 390 may absorb external light to serve to prevent a structure of the compensation part CP that is disposed below the light blocking layer 390 from being viewed from the outside, or may reduce the likelihood that a structure of the compensation part CP below the light blocking layer 390 is visible to the outside.

The first capping layer PS1 may be on (or disposed on) the second base 301 and the light blocking layer 390. The first capping layer PS1 may be made of an inorganic material. For example, the first capping layer PS1 may include silicon nitride, aluminum nitride, zirconium nitride, titanium nitride, hafnium nitride, tantalum nitride, silicon oxide, aluminum oxide, titanium oxide, tin oxide, cerium oxide, SiON, or the like.

The second capping layer PS2 may be on (or disposed on) the first capping layer PS1. The second capping layer PS2 may be made of an inorganic material. The second capping layer PS2 may be made of the same material as the first capping layer PS1, or may include at least one of the materials which are exemplified as constituent materials of the first capping layer PS1.

The filling layer 70 may be between (or disposed between) the second capping layer PS2 of the second substrate 30 and the thin film encapsulation layer 170 of the first substrate 10. The filling layer 70 may be in direct contact with the second capping layer PS2. The filling layer 70 may be made of a material which is capable of transmitting light. The filling layer 70 may be made of an organic material. Examples of the organic material may include a silicon-based organic material and an epoxy-based organic material, but the present disclosure is not limited thereto. Alternatively, in some embodiments, the filling layer 70 may be omitted.

As described above, the compensation electrode 123 of the compensation part CP may be electrically connected to the common electrode 150. Accordingly, even when the thickness of the common electrode 150 is decreased and thus electrical resistance is increased, the voltage drop may be minimized or reduced due to the compensation electrode 123, such that degradation in brightness of the display device 1 may be prevented, or the likelihood thereof may be reduced.

Hereinafter, the pixel PX is described in further detail.

Referring to FIG. 2 again, the plurality of pixels PX may be disposed in the first direction D1 or in the second direction D2.

Each of the pixels PX may include a first sub-pixel SP1, a second sub-pixel SP2, and a third sub-pixel SP3.

The first sub-pixel SP1 may emit first emitted light L1 having a first color, the second sub-pixel SP2 may emit second emitted light L2 having a second color, and the third sub-pixel SP3 may emit third emitted light L3 having a third color. For example, the first emitted light L1 having the first color may be red light having a peak wavelength in a range of about 610 nm to about 650 nm, the second emitted light L2 having the second color may be green light having a peak wavelength in a range of about 510 nm to about 550 nm, and the third emitted light L3 having the third color may be blue light having a peak wavelength in a range of about 430 nm to about 470 nm.

The first, second, and third sub-pixels SP1, SP2, and SP3 may be alternately arranged in row and column directions. Alternatively, the first, second, and third sub-pixels SP1, SP2, and SP3 may be arranged in a stripe manner, but the present disclosure is not limited thereto, and the first, second, and third sub-pixels SP1, SP2, and SP3 may be disposed in various manners such as a PenTile® manner, having a cluster of five pixels including two first sub-pixels SP1, two second sub-pixels SP2, and one central third sub-pixel SP3, for example, in a quincunx shape, and/or the like (PenTile® is a registered trademark of Samsung Display Co., Ltd.).

Referring to FIG. 4, the first sub-pixel SP1, the second sub-pixel SP2, and the third sub-pixel SP3 may respectively include light transmitting areas PA1, PA2, and PA3, which correspond to the first, second, and third sub-pixels SP1, SP2, and SP3, and light blocking areas PB. The light transmitting areas PA1, PA2, and PA3 may be areas in which light emitted from the first substrate 10 passes through the second substrate 30 to travel to the outside of the display device 1. The light blocking areas PB may be areas in which the light emitted from the first substrate 10 is not transmitted. The light blocking areas PB may be disposed to surround the light transmitting areas PA1, PA2, and PA3. The light transmitting areas PA1, PA2, and PA3 and the light blocking areas PB may be distinguished by the light blocking layer 390, described further below. The light transmitting areas PA1, PA2, and PA3 and the light blocking areas PB may be defined on the second substrate 30.

Further, the first, second, and third sub-pixels SP1, SP2, and SP3 may include light emitting areas corresponding thereto. The light emitting areas may be areas which emit light due to the light emitting layer 141, described further below. Non-light emitting areas may be disposed around the light emitting areas. The non-light emitting areas may be disposed to surround the light emitting areas, for example. The light emitting areas and the non-light emitting areas may be distinguished by the pixel defining layer 161, described further below. All types of light L, which are emitted from the light emitting areas, may have the same peak wavelength and may be converted into corresponding emitted colors of the first, second, and third sub-pixels SP1, SP2, and SP3 by wavelength conversion patterns 341 and 343, which are disposed in the first, second, and third sub-pixels SP1, SP2, and SP3, and/or a color filter layer 330, as described further below.

The first substrate 10 of the pixels PX may include the first base 101, the buffer layer BF, a semiconductor layer ACT, the first insulating layer IL1, the first conductive layer 110, the second insulating layer IL2, the second conductive layer 120, the third insulating layer IL3, the pixel defining layer 161, and light emitting devices ED1, ED2, and ED3. Each of the above-described layers may be formed of a single layer or may also be formed of a plurality of layers, e.g., may have a stacked structure. Another layer may be further disposed between the above-described layers. The first base 101, the buffer layer BF, the second insulating layer IL2, and the third insulating layer IL3 are described with reference to FIG. 3, and thus duplicative descriptions thereof may be omitted.

The semiconductor layer ACT may be disposed between the buffer layer BF and the first insulating layer IL1. The semiconductor layer ACT may form channels of a plurality of transistors of the pixels PX. The semiconductor layer ACT may include polycrystalline silicon. The polycrystalline silicon may be formed by crystallizing amorphous silicon.

When the semiconductor layer ACT is made of polycrystalline silicon and doped with ions, the ion-doped semiconductor layer ACT may have conductivity. Consequently, the semiconductor layer ACT may include not only channel regions of the plurality of transistors but also source regions and drain regions thereof. The source region and the drain region may be connected to both sides of each of the channel regions.

In another embodiment, the semiconductor layer ACT may include single crystalline silicon, low temperature polycrystalline silicon, amorphous silicon, and/or an oxide semiconductor. For example, the oxide semiconductor may include a binary compound ($AB_x$), a ternary compound ($AB_xC_y$), or a tetra compound ($AB_xC_yD_z$), which contains indium (In), zinc (Zn), gallium (Ga), tin (Sn), titanium (Ti), aluminum (Al), hafnium (Hf), zirconium (Zr), magnesium (Mg), and/or the like. In an embodiment, the semiconductor layer ACT may include ITZO (which is an oxide including indium, tin, and zinc) or indium gallium zinc oxide (IGZO) (which is an oxide including indium, gallium, and zinc).

The first conductive layer 110 may be disposed between the first insulating layer IL1 and the second insulating layer IL2. The first conductive layer 110 may include one or more metals selected from among Mo, Al, Pt, Pd, Ag, Mg, Au, Ni, Nd, Ir, Cr, Ca, Ti, Ta, W, and Cu. The first conductive layer 110 may be a single layer or may have a multilayer structure. The first conductive layer 110 may include a gate electrode of the transistor and a first electrode of a sustain capacitor.

The second conductive layer 120 may be disposed between the second insulating layer IL2 and the third insulating layer IL3. The second conductive layer 120 may include not only the above-described compensation electrode 123, but also a source electrode 121 and a drain electrode 122 of the transistor. The source electrode 121 and the drain electrode 122 may be respectively connected to the source region and the drain region of the semiconductor layer ACT through openings (e.g., contact holes) passing through the second insulating layer IL2 and the first insulating layer IL1.

The first electrode 130 may be disposed on the third insulating layer IL3. The first electrode 130 may include not only the above-described auxiliary electrode 135, but also a first pixel electrode 131, a second pixel electrode 132, and a third pixel electrode 133. The first, second, and third pixel electrodes 131, 132, and 133 may be disposed in the first, second, and third sub-pixels SP1, SP2, and SP3, respectively. Each of the first, second, and third pixel electrodes 131, 132, and 133 may be connected to the source electrode 121 or the drain electrode 122 through an opening (e.g., a contact hole) passing through the third insulating layer IL3.

The pixel defining layer 161 may be on (or disposed on) the first electrode 130. The pixel defining layer 161 is disposed along a boundary of each of the first, second, and third sub-pixels SP1, SP2, and SP3. The pixel defining layer 161 may include openings which partially expose the first, second, and third pixel electrodes 131, 132, and 133. The pixel defining layer 161 may be disposed to expose central portions of the first, second, and third pixel electrodes 131, 132, and 133 and to cover side surfaces of the first, second, and third pixel electrodes 131, 132, and 133.

The openings of the pixel defining layer 161 may define light emitting regions of the first, second, and third sub-pixels SP1, SP2, and SP3.

The pixel defining layer 161 may include the same material as the above-described partition wall 163. For example, the pixel defining layer 161 may be made of an inorganic material. The inorganic material may include $SiO_x$, $SiN_x$, or $SiON_x$. According to embodiments, the pixel defining layer 161 may serve to block an out-gas, which is generated from an adjacent layer, from being introduced into the light emitting layer 141.

For example, when the third insulating layer IL3 is formed of an organic material, an out-gas may be generated from the third insulating layer IL3 and introduced into the light emitting layer 141 to cause degradation of a light emitting device. Accordingly, when the pixel defining layer 161 disposed on the third insulating layer IL3 is formed of an inorganic material, it is possible to effectively prevent degradation of an element due to the out-gas, or to reduce the likelihood of degradation due to the out-gas.

Unlike the partition wall 163, a cross-sectional shape of the pixel defining layer 161 may have a forward-tapered shape. That is, a side surface of the pixel defining layer 161 may have a forward-tapered shape. A second tapered angle θ2 between the side surface of the pixel defining layer 161 and an upper surface of each of the first, second, and third pixel electrodes 131, 132, and 133 may be smaller than the first tapered angle θ1 between the side surface of the partition wall 163 and the upper surface of the auxiliary electrode 135.

The pixel defining layer 161 may at least partially overlap the light blocking layer 390 and/or a separation wall 370 in the thickness direction (e.g., the third direction D3). Additional description thereof is provided below.

The light emitting layer 141 may be disposed on the first electrode 130 and the pixel defining layer 161. The light emitting layer 141 may have a shape of a consecutive layer which is formed over the first electrode 130 and the pixel defining layer 161. The light emitting layer 141 may be disposed on the first, second, and third pixel electrodes 131, 132, and 133, which are exposed (e.g., at least partially exposed) by the openings of the pixel defining layer 161, to be in contact with the first, second, and third pixel electrodes 131, 132, and 133.

The light emitting layer 141 is described in further detail with reference to FIGS. 5-7.

Figure 5:
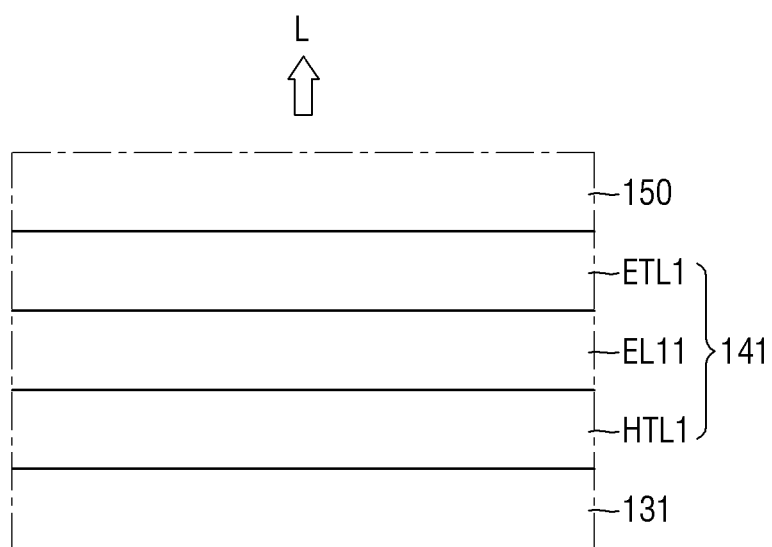
FIG. 5 is an enlarged cross-sectional view of a light emitting device of FIG. 2.

FIG. 5 is an enlarged cross-sectional view of the light emitting device of FIG. 2. FIGS. 6 and 7 are cross-sectional views illustrating modified examples of the light emitting device of FIG. 5.

Referring to FIG. 5, the light emitting layer 141 may have a structure in which a plurality of layers is stacked. For example, the light emitting layer 141 may include a first hole transport layer HTL1, a first light emitting material layer EL11, and a first electron transport layer ETL1. The first hole transport layer HTL1 may be disposed on the first pixel electrode 131, the first light emitting material layer EL11 may be disposed on the first hole transport layer HTL1, and the first electron transport layer ETL1 may be disposed on the first light emitting material layer EL11. The first light emitting material layer EL11 may emit blue light, but the present disclosure is not limited thereto.

Figure 6:
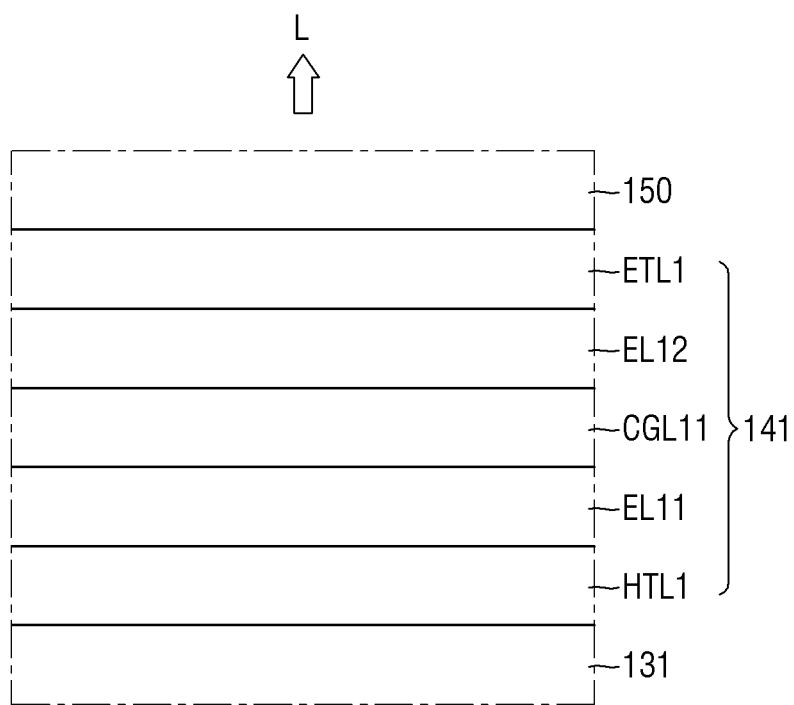
FIGS. 6-7 are cross-sectional views illustrating modified examples of the light emitting device of FIG. 5.

Further, as shown in FIG. 6, the light emitting layer 141 may further include a first charge generation layer CGL11 and a second light emitting material layer EL12. The first charge generation layer CGL11 may be disposed on the first light emitting material layer EL11, and the second light emitting material layer EL12 may be disposed on the first charge generation layer CGL11.

The first charge generation layer CGL11 may serve to inject charges into adjacent light emitting material layers EL11 and EL12, and to adjust charge balance between the first light emitting material layer EL11 and the second light emitting material layer EL12. The first charge generation layer CGL11 may include an n-type charge generation layer and a p-type charge generation layer. The p-type charge generation layer may be disposed on the n-type charge generation layer.

The second light emitting material layer EL12 may emit the same colored light as that of the first light emitting material layer EL11. For example, the second light emitting material layer EL12 may emit blue light having the same peak wavelength as the first light emitting material layer EL11, or may emit blue light having a peak wavelength that is different from that of the first light emitting material layer EL11. However, the present disclosure is not limited thereto, and the second light emitting material layer EL12 may emit colored light that is different from that of the first light emitting material layer EL11. For example, the second light emitting material layer EL12 may emit green light, and the first light emitting material layer EL11 may emit blue light. According to the embodiment shown in FIG. 6, the light emitting layer 141 includes the two light emitting material layers EL11 and EL12 such that light emission efficiency and lifespan may be improved, as compared with the embodiment shown in FIG. 5.

Figure 7:
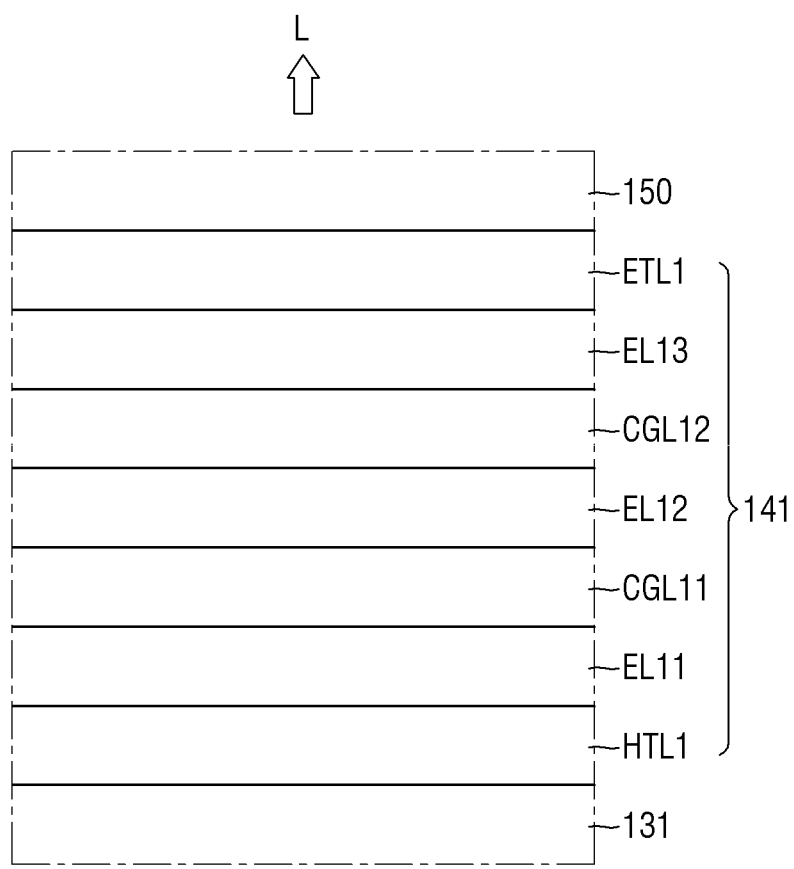

Further, as shown in FIG. 7, the light emitting layer 141 may further include a second charge generation layer CGL12 and a third light emitting material layer EL13. The second charge generation layer CGL12 may be disposed on the second light emitting material layer EL12 and the first electron transport layer ETL1, and the third light emitting material layer EL13 may be disposed on the second charge generation layer CGL12.

The third light emitting material layer EL13 may emit the same colored light as that of the first light emitting material layer EL11 and/or the second light emitting material layer EL12. For example, the third light emitting material layer EL13 may emit blue light having the same peak wavelength as that of the first light emitting material layer EL11 and/or the second light emitting material layer EL12, or may emit blue light having a peak wavelength that is different from that of the first light emitting material layer EL11 and/or the second light emitting material layer EL12. However, the present disclosure is not limited thereto, and the third light emitting material layer EL13 may emit colored light that is different from that of the first light emitting material layer EL11 and/or the second light emitting material layer EL12. For example, each of the first, second, and third light emitting material layers EL11, EL12, and EL13 may emit blue or green light, or the first, second, and third light emitting material layers EL11, EL12, and EL13 may emit red light, green light, and blue light, such that an entirety of the light emitting material layers EL11, EL12, and EL13 may emit white light (or such that the first, second, and third light emitting materials layers EL11, EL12, and EL13 together emit white light).

Referring to FIG. 4 again, the common electrode 150 may be disposed on the light emitting layer 141. The common electrode 150 may be a common layer which is formed over the light emitting layer 141.

The first pixel electrode 131, the light emitting layer 141, and the common electrode 150 may constitute a first light emitting device ED1, the second pixel electrode 132, the light emitting layer 141, and the common electrode 150 may constitute a second light emitting device ED2, and the third pixel electrode 133, the light emitting layer 141, and the common electrode 150 may constitute a third light emitting device ED3. Light L emitted from the first, second, and third light emitting devices ED1, ED2, and ED3 may be provided to the second substrate 30.

The thin film encapsulation layer 170 is on (or disposed on) the common electrode 150. The thin film encapsulation layer 170 is described with reference to FIG. 3, and thus a duplicative description thereof may be omitted.

A panel light blocking layer 180 may be on (or disposed on) the thin film encapsulation layer 170. The panel light blocking layer 180 may be disposed to overlap the non-light emitting area, e.g., the pixel defining layer 161. The panel light blocking layer 180 may prevent, or reduce the likelihood of, a mixed color occurrence due to light invading between adjacent light emitting areas, such that color reproducibility may be further improved. The panel light blocking layer 180 may include an organic light blocking material and may be formed through a process of coating and exposing the organic light blocking material.

The second substrate 30 may be disposed above the panel light blocking layer 180 of the first substrate 10.

The second substrate 30 may include the second base 301, the light blocking layer 390, the color filter layer 330, the separation wall 370, the wavelength conversion patterns 341 and 343, a light transmission pattern 345, the first capping layer PS1, and the second capping layer PS2. The second base 301, the first capping layer PS1, and the second capping layer PS2 are described with reference to FIG. 3, and thus duplicative descriptions thereof may be omitted.

The light blocking layer 390 is on (or disposed on) the second base 301. The light blocking layer 390 may be disposed to overlap the light blocking areas PB along boundaries of the plurality of light transmitting areas PA1, PA2, and PA3. The light blocking layer 390 may overlap the separation wall 370, which is described further below, in the thickness direction (e.g., the third direction D3). The light blocking layer 390 may absorb external light to reduce color distortion due to reflection of the external light. Further, the light blocking layer 390 may prevent, or reduce the likelihood of, a mixed color occurrence due to light invading between adjacent light transmitting areas PA1, PA2, and PA3, such that color reproducibility may be further improved.

The color filter layer 330 may be disposed between the light blocking layer 390 and the first capping layer PS1. The color filter layer 330 may include a first color filter 331, a second color filter 332, and a third color filter 333. The first, second, and third color filters 331, 332, and 333 may be disposed to overlap the first, second, and third sub-pixels SP1, SP2, and SP3, respectively. Further, the first, second, and third color filters 331, 332, and 333 may be respectively disposed to overlap the light transmitting areas PA1, PA2, and PA3 of the first, second, and third sub-pixels SP1, SP2, and SP3. Further, boundaries between the first, second, and third color filters 331, 332, and 333 may be located in the light blocking areas PB.

Each of the first, second, and third color filters 331, 332, and 333 may selectively transmit specific colored light and absorb colored light that is different from the specific colored light, thereby preventing the different colored light from traveling therethrough, or may reduce the likelihood of different colored light from traveling therethrough.

For example, the first color filter 331 may selectively transmit the first colored light (e.g., red light) and block or absorb the second colored light (e.g., green light) and the third colored light (e.g., blue light). The first color filter 331 may be a red color filter and may include a red colorant, such as a red dye or a red pigment. In the present disclosure, the colorant may be understood as a concept including both of a dye and a pigment.

Further, the second color filter 332 may selectively transmit the second colored light (e.g., the green light) and block or absorb the first colored light (e.g., the red light) and the third colored light (e.g., the blue light). The second color filter 332 may be a green color filter and may include a green colorant, such as a green dye or a green pigment.

Further, the third color filter 333 may selectively transmit the third colored light (e.g., the blue light) and block or absorb the first colored light (e.g., the red light) and the second colored light (e.g., the green light). The third color filter 333 may be a blue color filter and may include a blue colorant, such as a blue dye or a blue pigment.

The color filter layer 330 may be in direct contact with the first capping layer PS1. The first capping layer PS1 may prevent impurities, such as moisture or air which infiltrate from the outside, from damaging or contaminating the color filter layer 330, or may reduce the likelihood thereof. Further, the first capping layer PS1 may prevent the colorant, which is included in the color filter layer 330, from diffusing to another configuration, or may reduce the likelihood thereof.

The separation wall 370 may be disposed between the first capping layer PS1 and the second capping layer PS2. The separation wall 370 may be disposed to overlap the light blocking areas PB along the boundaries of the plurality of light transmitting areas PA1, PA2, and PA3. The separation wall 370 may include openings which expose areas overlapping the light transmitting areas PA1, PA2, and PA3 of one surface of the first capping layer PS1. The wavelength conversion patterns 341 and 343 and the light transmission pattern 345, described further below, may be disposed in the openings of the separation wall 370. The separation wall 370 may serve as a guide for stably positioning an ink composition for forming the wavelength conversion patterns 341 and 343 and the light transmission pattern 345 at a desired position.

The separation wall 370 may be made of an organic material and, for example, may be made of a photosensitive organic material. The photosensitive organic material may be a negative photosensitive material in which curing occurs in a light irradiated portion, but the present disclosure is not limited thereto. The separation wall 370 may further include a light blocking material. According to embodiments, the separation wall 370 may be disposed to overlap the light blocking areas PB to block light from being transmitted.

The wavelength conversion patterns 341 and 343 and the light transmission pattern 345 may be disposed in the openings of the separation wall 370. The wavelength conversion patterns 341 and 343 and the light transmission pattern 345 may be disposed at substantially the same level (or may have the same or substantially the same height along the third direction D3).

The wavelength conversion patterns 341 and 343 and the light transmission pattern 345 may be disposed within the openings of the separation wall 370. Accordingly, upper surfaces of the wavelength conversion patterns 341 and 343 and the light transmission pattern 345 may be in contact with the first capping layer PS1, and side surfaces of the wavelength conversion patterns 341 and 343 and the light transmission pattern 345 may be in contact with the separation wall 370. The wavelength conversion patterns 341 and 343 and the light transmission pattern 345 may be formed in an ink jet manner using an ink composition. However, the present disclosure is not limited thereto, and the wavelength conversion patterns 341 and 343 and the light transmission pattern 345 may be formed by applying a photosensitive material and exposing and developing the photosensitive material.

The wavelength conversion patterns 341 and 343 may convert a peak wavelength of incident light into light of a specific peak wavelength to emit the light having the specific peak wavelength. The wavelength conversion patterns 341 and 343 may include a first wavelength conversion pattern 341 and a second wavelength conversion pattern 343.

The first wavelength conversion pattern 341 may be disposed to overlap the light transmitting area PA1 of the first sub-pixel SP1 and may not be disposed in the light transmitting areas PA2 and PA3 of the second sub-pixel SP2 and the third sub-pixel SP3. That is, the first wavelength conversion pattern 341 may not overlap the second sub-pixel SP2 and the third sub-pixel SP3.

The first wavelength conversion pattern 341 may convert blue light into red light ranging from about 610 nm to about 650 nm to emit the red light. A thickness of the first wavelength conversion pattern 341 may range from about 3 μm to about 15 μm.

The first wavelength conversion pattern 341 may include a first base resin 341a, and a first wavelength conversion material 341b and/or first scatterers 341c, which are distributed in the first base resin 341a.

The first base resin 341a is not particularly limited as long as it is a material having high light transmittance and an excellent distribution property with respect to the first wavelength conversion material 341b and the first scatterers 341c. For example, the first base resin 341a may be made of an organic material having high light transmittance. Examples of the organic material may include one or more of epoxy-based resins, acrylic-based resins, cardo-based resins, and imide-based resins.

The first wavelength conversion material 341b may convert a peak wavelength of incident light into a specific peak wavelength. Examples of the first wavelength conversion material 341b include quantum dots, quantum rods, and phosphors. The quantum dot may be a particulate matter which emits light of a specific wavelength as electrons transit from a conduction band to a valence band.

The quantum dot may be a semiconductor nanocrystalline material. The quantum dot may have a specific band gap according to a composition and a size and absorb light to emit light having an inherent wavelength. Examples of the semiconductor nanocrystalline material of the quantum dot may include a group IV-based nanocrystalline material, a group II-VI-based nanocrystalline compound, a group III-V-based nanocrystalline compound, a group IV-VI-based nanocrystalline material, or a combination thereof.

Examples of the group IV-based nanocrystalline material may include silicon (Si), germanium (Ge), or a binary compound, such as silicon carbide (SiC), silicon-germanium (SiGe), or the like, but the present disclosure is not limited thereto.

Further, examples of the group II-VI-based nanocrystalline compound may include binary compounds such as CdSe, CdTe, ZnS, ZnSe, ZnTe, ZnO, HgS, HgSe, HgTe, MgSe, MgS, and a mixture thereof, ternary compounds such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, or tetra compounds such as HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof, but the present disclosure is not limited thereto.

Further, examples of the group III-V-based nanocrystalline compound may include binary compounds such as GaN, GaP, GaAs, GaSb, AlN, AlP, AlAs, AlSb, InN, InP, InAs, InSb, and a mixture thereof, ternary compounds such as GaNP, GaNAs, GaNSb, GSPAs, GSPSb, AlNP, AlNAs, AlNSb, AlPAs, AlPSb, InNP, InNAs, InNSb, InPAs, InPSb, GaAlNP, and a mixture thereof, or tetra compounds such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof, but the present disclosure is not limited thereto.

Examples of the group IV-VI-based nanocrystalline material may include binary compounds such as SnS, SnSe, SnTe, PbS, PbSe, PbTe, and a mixture thereof; ternary compounds such as SnSeS, SnSeTe, SnSTe, PbSeS, PbSeTe, PbSTe, SnPbS, SnPbSe, SnPbTe, and a mixture thereof or tetra compounds such as SnPbSSe, SnPbSeTe, SnPbSTe, and a mixture thereof, but the present disclosure is not limited thereto.

The quantum dot may have a core-shell structure which includes a core having the above-described nanocrystals and a shell surrounding the core. The shell of the quantum dot may serve as a protective layer for preventing chemical modification of the core to maintain a semiconductor characteristic and/or as a charging layer for imparting an electrophoretic characteristic to the quantum dot. The shell may be a single layer or a multilayer. Examples of the shell of the quantum dot may include metal or non-metal oxides, semiconductor compounds, or combinations thereof.

Examples of the metal or non-metal oxides may include binary compounds such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$ or ternary compounds such as $MgAl_2O_4$, $CoFe_2O_4$, $NiFe_2O_4$, and $CoMn_2O_4$, but the present disclosure is not limited thereto.

Further, examples of the semiconductor compound may include CdS, CdSe, CdTe, ZnS, ZnSe, ZnTe, GaAs, GaP, GaSb, HgS, HgSe, HgTe, InAs, InP, InSb, AlAs, AlP, and AlSb, but the present disclosure is not limited thereto.

Light emitted from the first wavelength conversion material 341b may have a full width at half maximum (FWHM) of about 45 nm or less, or about 40 nm or less, or about 30 nm or less with respect to a light emission wavelength spectrum. Thus, color purity and color reproducibility of a color displayed by the display device 1 may be improved. Further, the light emitted from the first wavelength conversion material 341b may be irradiated in various directions irrespective of an incident direction of incident light. Consequently, visibility for a side surface of the display device 1 may be improved.

Some amount of the light L, which is emitted from the first light emitting device ED1, may pass through the first wavelength conversion pattern 341 to be emitted without being converted into red light by the first wavelength conversion material 341b. A component of the light L, which is incident on the first color filter 331 without being converted by the first wavelength conversion pattern 341, may be blocked by the first color filter 331. On the other hand, the red light converted by the first wavelength conversion pattern 341 may pass through the first color filter 331 to be emitted to the outside. Accordingly, the first emitted light L1, which is emitted from the first light transmitting area PA1 to the outside, may be red light.

The first scatterer 341c may have a refractive index that is different from that of the first base resin 341a and form an optical interface with the first base resin 341a. For example, the first scatterer 341c may be light scattering particles. The first scatterer 341c is not particularly limited as long as it is a material that is capable of scattering at least some amount of transmitted light. For example, the first scatterer 341c may be a particle of a metal oxide or an organic particle material. Examples of the metal oxide may include titanium dioxide ($TiO_2$), zirconium oxide ($ZrO_2$), aluminum oxide ($Al_2O_3$), indium oxide ($In_2O_3$), zinc oxide (ZnO), and tin oxide ($SnO_2$), and examples of the organic particle material may include an acrylic-based resin and a urethane-based resin. The first scatterer 341c may scatter the light passing through the first wavelength conversion pattern 341 in a random direction irrespective of an incident direction of incident light without substantially converting a wavelength of the light. Consequently, a path length of light passing through the first wavelength conversion pattern 341 may be increased, and color conversion efficiency by the first wavelength conversion material 341b may be increased.

The second wavelength conversion pattern 343 may be disposed to overlap the second light transmitting area PA2 of the second sub-pixel SP2 and may not be disposed in the first light transmitting area PA1 of the first sub-pixel SP1 and the third light transmitting area PA3 of the third sub-pixel SP3. That is, the second wavelength conversion pattern 343 may not overlap the first light transmitting area PA1 and the third light transmitting area PA3.

The second wavelength conversion pattern 343 may convert blue light into green light ranging from about 510 nm to about 550 nm to emit the green light.

The second wavelength conversion pattern 343 may include a second base resin 343a, and a second wavelength conversion material 343b and/or second scatterers 343c, which are distributed in the second base resin 343a.

The second base resin 343a is not particularly limited as long as it is a material having high light transmittance and an excellent distribution property with respect to the second wavelength conversion material 343b and the second scatterers 343c. For example, the second base resin 343a may include the same material as the above-described first base resin 341a or may include one or more materials selected from among the materials which are exemplified as constituent materials of the first base resin 341a.

The second wavelength conversion material 343b may convert a peak wavelength of incident light into a specific peak wavelength. The second wavelength conversion material 343b may convert blue light having a peak wavelength ranging from about 430 nm to about 470 nm into green light having a peak wavelength ranging from about 510 nm to about 550 nm.

Examples of the second wavelength conversion material 343b include quantum dots, quantum rods, and/or phosphors. When both of the second wavelength conversion material 343b and the first wavelength conversion material 341b are made of quantum dots, a diameter of the quantum dot constituting the first wavelength conversion material 341b may be larger than that of the quantum dot constituting the second wavelength conversion material 343b. For example, a size of the quantum dot of the first wavelength conversion material 341b may range from about 55 Å to 65 Å. Further, a size of the quantum dot of the second wavelength conversion material 343b may range from about 40 Å to about 50 Å.

Some amount of the light L, which is provided from the second light emitting device ED2, may pass through the second wavelength conversion pattern 343 to be emitted without being converted into green light by the second wavelength conversion material 343b. A component of the light L, which is incident on the second color filter 332 without being converted by the second wavelength conversion pattern 343, may be blocked by the second color filter 332. On the other hand, the green light converted by the second wavelength conversion pattern 343 may pass through the second color filter 332 to be emitted to the outside. Accordingly, the second emitted light L2, which is emitted from the second light transmitting area PA2 to the outside, may be green light. In addition to the above description, the second wavelength conversion material 343b may be substantially the same as or similar to the first wavelength conversion material 341b described above, and thus a duplicative description thereof may be omitted.

The second scatterer 343c may have a refractive index that is different from that of the second base resin 343a and may form an optical interface with the second base resin 343a. For example, the second scatterer 343c may be a light scattering particle. In addition to the above description, the second scatterer 343c may be substantially the same as or similar to the first scatterer 341c described above, and thus a duplicative description thereof may be omitted.

The light transmission pattern 345 may be disposed to overlap the light transmitting area PA3 of the third sub-pixel SP3. Further, the light transmission pattern 345 may not be disposed in the light transmitting areas PA1 and PA2 of the first sub-pixel SP1 and the second sub-pixel SP2. That is, the light transmission pattern 345 may not overlap the first sub-pixel SP1 and the second sub-pixel SP2.

The light transmission pattern 345 may transmit the light L provided from the third light emitting device ED3 to provide the light L to the third color filter 333. That is, the light provided to the third color filter 333 may be blue light and may have the same wavelength as the light L emitted from the third light emitting device ED3.

The light transmission pattern 345 may include a third base resin 345a and third scatterers 345b which are distributed in the third base resin 345a.

The third base resin 345a is not particularly limited as long as it is a material having high light transmittance and an excellent distribution property with respect to the third scatterer 345b. For example, the third base resin 345a may be formed of the same material as the above-described first base resin 341a, or may include one or more materials selected from among the materials which are exemplified as the constituent materials of the first base resin 341a.

The third scatterer 345b may have a refractive index that is different from that of the third base resin 345a, and may form an optical interface with the third base resin 345a. For example, the third scatterer 345b may be a light scattering particle. In addition to the above description, the third scatterer 345b may be substantially the same as or similar to the first scatterer 341c described above, and thus a duplicative description thereof may be omitted.

The second capping layer PS2 may be disposed on the wavelength conversion patterns 341 and 343 and the light transmission pattern 345. The second capping layer PS2 may cover one surface of each of the light transmission pattern 345, the wavelength conversion patterns 341 and 343, and the separation wall 370. The second capping layer PS2 may seal the wavelength conversion patterns 341 and 343 and the light transmission pattern 345 together with the first capping layer PS1. Accordingly, it is possible to prevent or substantially prevent impurities, such as moisture or air infiltrating from the outside, from damaging or contaminating the wavelength conversion patterns 341 and 343 and the light transmission pattern 345.

The second capping layer PS2 may cover one surface of each of the light transmission pattern 345, the wavelength conversion patterns 341 and 343, and the separation wall 370. The second capping layer PS2 may seal the wavelength conversion patterns 341 and 343 and the light transmission pattern 345, together with the first capping layer PS1. Accordingly, it is possible to prevent or substantially prevent impurities, such as moisture or air infiltrating from the outside, from damaging or contaminating the wavelength conversion patterns 341 and 343 and the light transmission pattern 345.

According to the above-described display device 1, the compensation electrode 123 of the compensation part CP may be electrically connected to the common electrode 150 to minimize, or reduce, the voltage drop of the display device 1. Accordingly, even when the thickness of the common electrode 150 is formed to be small, or the display device 1 is implemented as a large-area display device, it is possible to minimize or prevent degradation in brightness of the display device 1, or to reduce the likelihood thereof.

Hereinafter, another embodiment is described. In the following embodiment, the same reference numerals will be assigned to components which are the same as the above-described components, and duplicative descriptions may be omitted or simplified.

Figure 8:
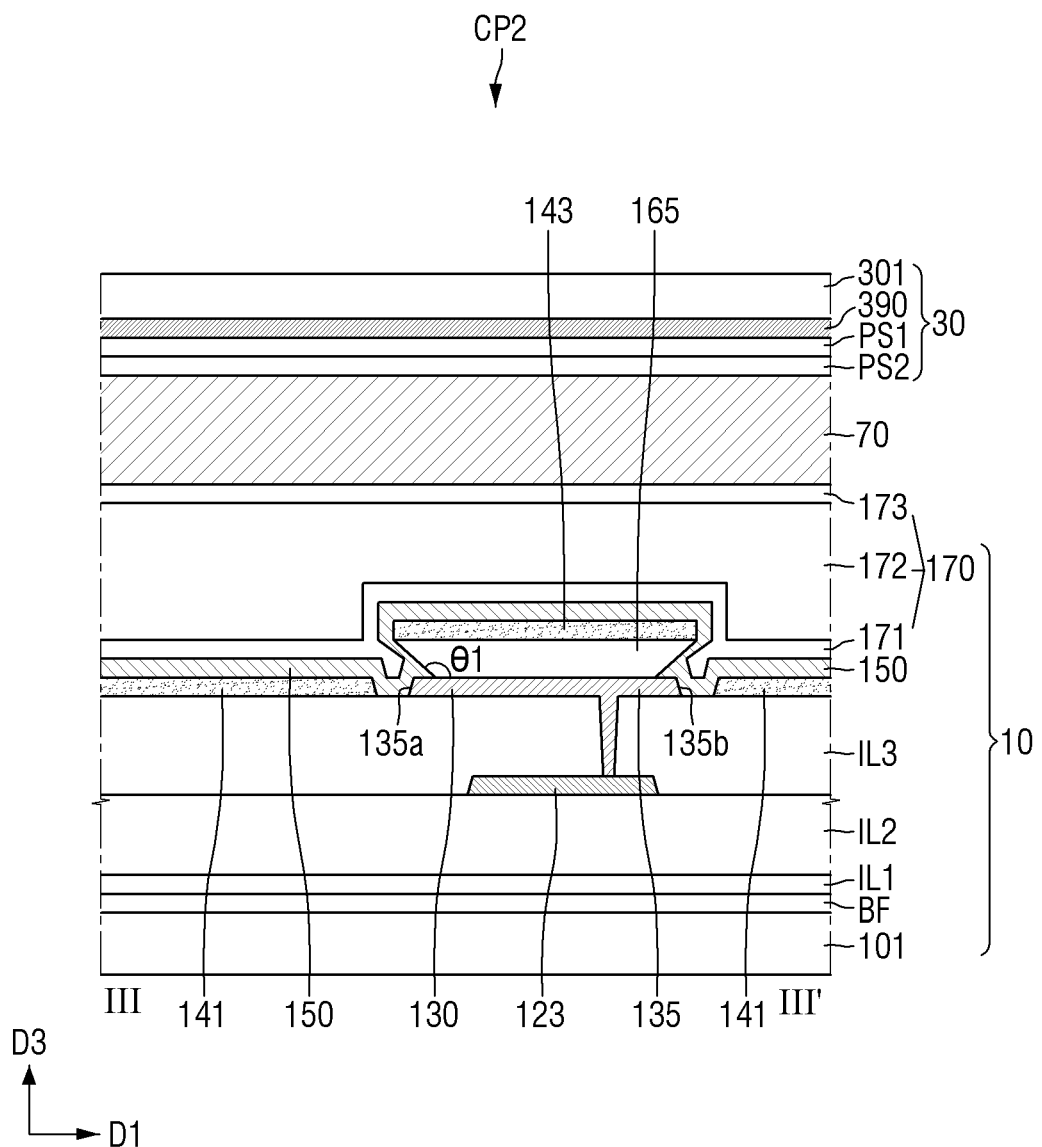
FIG. 8 is a cross-sectional view illustrating a compensation part according to an example embodiment of the present disclosure.

FIG. 8 is a cross-sectional view illustrating a compensation part according to another embodiment of the present disclosure.

Referring to FIG. 8, a compensation part CP2 according to the present embodiment is different from that according to the embodiment of FIGS. 1-7 in that the compensation part CP2 includes a conductive partition wall 165.

For example, the conductive partition wall 165 may be disposed on a first electrode 130. The conductive partition wall 165 may be disposed between an auxiliary electrode 135 and an organic layer 143. A lower surface of the conductive partition wall 165 may be in contact with an upper surface of the auxiliary electrode 135, and an upper surface of the conductive partition wall 165 may be in direct contact with a lower surface of the organic layer 143.

The conductive partition wall 165 may include one or more metals selected from among Mo, Al, Pt, Pd, Ag, Mg, Au, Ni, Nd, Ir, Cr, Ca, Ti, Ta, W, and Cu.

A cross-sectional shape of the conductive partition wall 165 may have a reverse-tapered shape. That is, a side surface of the conductive partition wall 165 may have a reverse-tapered shape. A first tapered angle θ1 between the side surface of the conductive partition wall 165 and the upper surface of the auxiliary electrode 135 may range from about 95° to about 150°. Alternatively, the first tapered angle θ1 may range from about 105° to about 120°, but the present disclosure is not limited thereto.

A width of the upper surface of the conductive partition wall 165 may be greater than that of the lower surface thereof. The lower surface of the conductive partition wall 165 may be defined as a surface in contact with the auxiliary electrode 135, and the upper surface of the conductive partition wall 165 may be defined as a surface opposite the lower surface of the conductive partition wall 165.

The width of the lower surface of the conductive partition wall 165 may be smaller than that of the upper surface of the auxiliary electrode 135. Alternatively, the width of the upper surface of the conductive partition wall 165 may be greater than that of the upper surface of the auxiliary electrode 135. The conductive partition wall 165 may expose both of a first side surface 135a, which is disposed on one side of the upper surface of the auxiliary electrode 135, and a second side surface 135b which is disposed on the other side of the upper surface thereof.

The first side surface 135a and the second side surface 135b of the auxiliary electrode 135 may overlap the upper surface of the conductive partition wall 165 in the thickness direction (e.g., the third direction D3), thereby being covered by the upper surface of the conductive partition wall 165. Accordingly, even when the organic layer 143 or a light emitting layer 141 is formed over a first base 101, the organic layer 143 or the light emitting layer 141 is not disposed on the first side surface 135a and the second side surface 135b of the auxiliary electrode 135. Consequently, it is possible to secure contacts between the first and second side surfaces 135a and 135b of the auxiliary electrode 135 and a common electrode 150. Accordingly, as described above, a voltage drop due to a reduction in thickness of the common electrode 150 may be minimized or reduced.

Further, as described above, when the conductive partition wall 165 is formed in a reverse-tapered shape, the organic layer 143 may be disposed on only the upper surface of the conductive partition wall 165 and may not be actually disposed on the side surface of the conductive partition wall 165. That is, the side surface of the conductive partition wall 165 may not be covered by the organic layer 143 but may be exposed. On the other hand, the common electrode 150 having higher step coverage than that of the organic layer 143 may also be disposed on the side surface of the conductive partition wall 165. That is, the common electrode 150 may be in direct contact with the side surface of the conductive partition wall 165. Accordingly, the conductive partition wall 165 may serve as an electrode substantially the same as the auxiliary electrode 135. That is, the common electrode 150 may be electrically connected to a compensation electrode 123 through the conductive partition wall 165 and the auxiliary electrode 135. Accordingly, a voltage drop due to a reduction in thickness of the common electrode 150 may be prevented more effectively, or the likelihood thereof may be reduced.

Other components, except for the above-described components, are substantially the same as or similar to those described with reference to FIG. 3, and thus duplicative descriptions thereof may be omitted.

Figure 9:
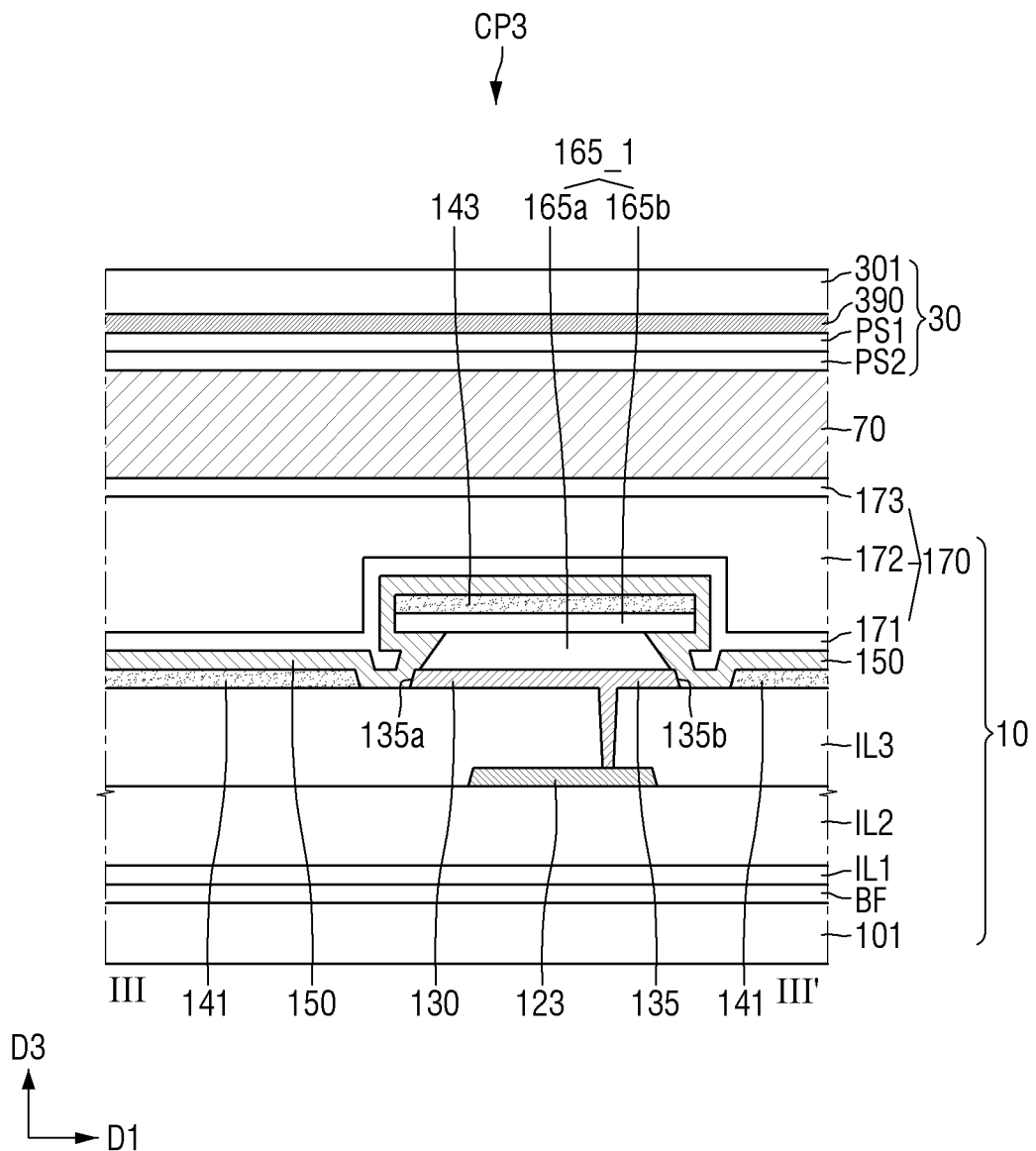
FIG. 9 is a cross-sectional view illustrating a compensation part according to an example embodiment of the present disclosure.

FIG. 9 is a cross-sectional view illustrating a compensation part according to still another embodiment of the present disclosure.

Referring to FIG. 9, a compensation part CP3 according to the present embodiment is different from that according to the embodiment of FIG. 8 in that a conductive partition wall 165_1 includes a first metal layer 165a and a second metal layer 165b.

The first metal layer 165a and the second metal layer 165b may be sequentially stacked. That is, the first metal layer 165a may be disposed between an auxiliary electrode 135 and the second metal layer 165b, and the second metal layer 165b may be disposed between the first metal layer 165a and an organic layer 143.

The first metal layer 165a and the second metal layer 165b may include one or more metals selected from among Mo, methylrhenium trioxide (MTO), Al, Pt, Pd, Ag, Mg, Au, Ni, Nd, Ir, Cr, Ca, Ti, Ta, W, and Cu. The first metal layer 165a and the second metal layer 165b may be made of different materials. For example, the first metal layer 165a may be formed of Mo, and the second metal layer 165b may include MTO.

A thickness of the first metal layer 165a may be greater than that of the second metal layer 165b.

A width of an upper surface of the first metal layer 165a may be smaller than that of a lower surface thereof. Alternatively, the width of the upper surface of the first metal layer 165a may be smaller than that of a lower surface of the second metal layer 165b. The width of the lower surface of the first metal layer 165a may be smaller than that of the lower surface of the second metal layer 165b.

The first metal layer 165a may expose a first side surface 135a and a second side surface 135b of the auxiliary electrode 135. The first side surface 135a and the second side surface 135b of the auxiliary electrode 135 may overlap the second metal layer 165b in the thickness direction (e.g., the third direction D3), thereby being covered by the second metal layer 165b. Accordingly, even when the organic layer 143 or a light emitting layer 141 is formed over a first base 101, the organic layer 143 or the light emitting layer 141 is not disposed on the first side surface 135a and the second side surface 135b of the auxiliary electrode 135. Consequently, it is possible to secure contacts between the first and second side surfaces 135a and 135b of the auxiliary electrode 135 and a common electrode 150. Accordingly, as described above, a voltage drop due to a reduction in thickness of the common electrode 150 may be minimized or reduced.

Further, an end portion of the second metal layer 165b may protrude more than an end portion of the upper surface of the first metal layer 165a. A side surface of the first metal layer 165a may be at least partially covered by the second metal layer 165b. Accordingly, the organic layer 143 may be disposed on an upper surface of the second metal layer 165b and may not be disposed on the side surface of the first metal layer 165a. That is, the side surface of the first metal layer 165a may not be covered by the organic layer 143 but may be exposed. On the other hand, the common electrode 150 having higher step coverage than that of the organic layer 143 may also be disposed on the side surface of the first metal layer 165a. That is, the common electrode 150 may be in direct contact with the side surface of the first metal layer 165a. Accordingly, the side surface of the first metal layer 165a may serve as an electrode substantially the same as the auxiliary electrode 135. That is, the common electrode 150 may be electrically connected to a compensation electrode 123 through the side surface of the first metal layer 165a and the auxiliary electrode 135. Consequently, as described above, a voltage drop due to a reduction in thickness of the common electrode 150 may be prevented more effectively, or may be reduced.

Figure 10:
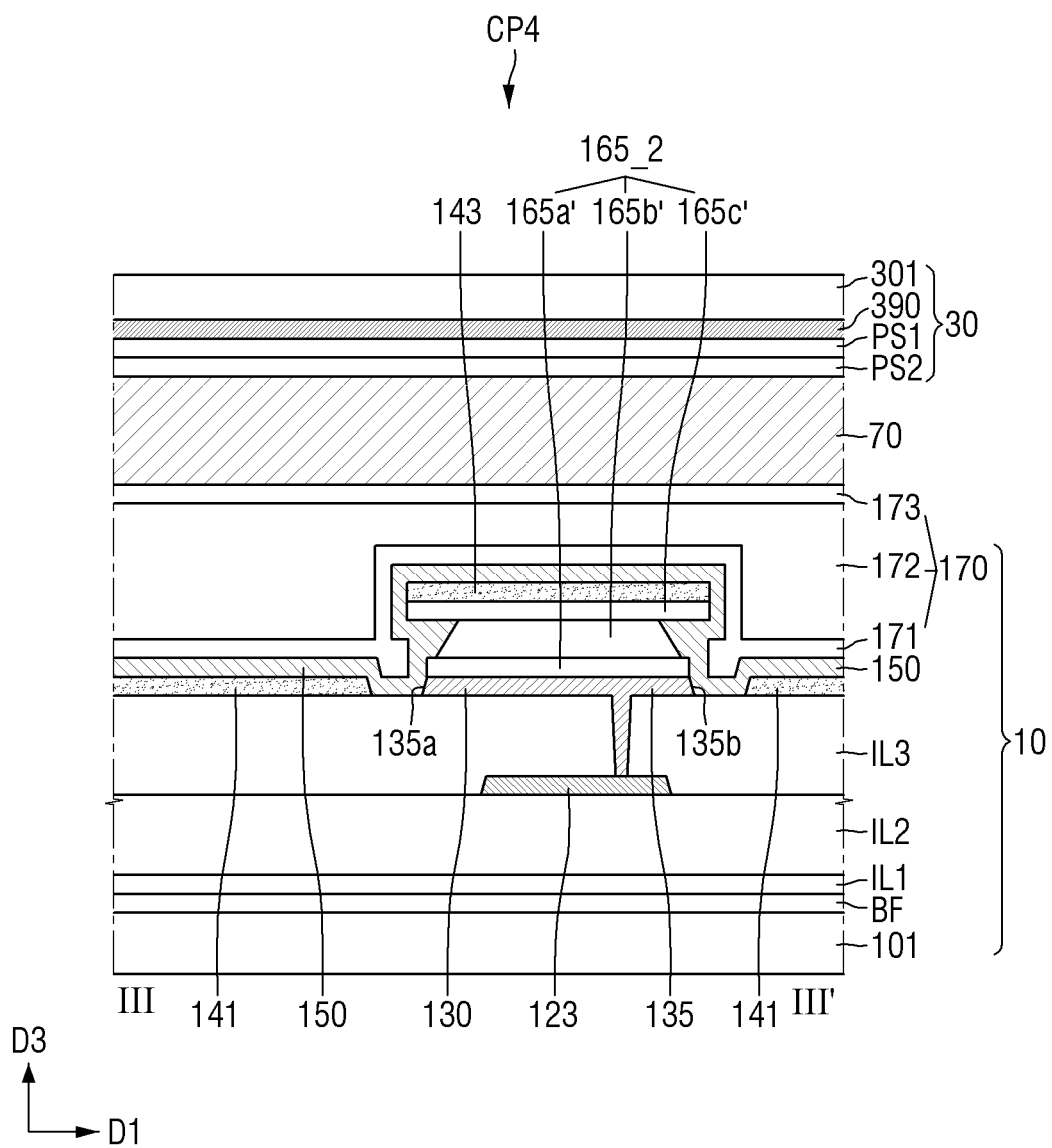
FIG. 10 is a cross-sectional view illustrating a compensation part according to an example embodiment of the present disclosure.

FIG. 10 is a cross-sectional view illustrating a compensation part according to yet another embodiment of the present disclosure.

Referring to FIG. 10, a compensation part CP4 according to the present embodiment is different from that according to the embodiments of FIGS. 8 and 9 in that a conductive partition wall 165_2 includes a first metal layer 165a', a second metal layer 165b', and a third metal layer 165c'.

The first metal layer 165a', the second metal layer 165b', and the third metal layer 165c' are sequentially stacked. A lower surface of the first metal layer 165a' may be in contact with an auxiliary electrode 135, and an upper surface of the first metal layer 165a' may be in contact with a lower surface of the second metal layer 165b'. Further, an upper surface of the second metal layer 165b' may be in contact with a lower surface of the third metal layer 165c', and an upper surface of the third metal layer 165c' may be in contact with a lower surface of an organic layer 143.

The first metal layer 165a', the second metal layer 165b', and the third metal layer 165c' may include one or more metals selected from among Al, Ti, Mo, Pt, Pd, Ag, Mg, Au, Ni, Nd, Ir, Cr, Ca, Ta, W, and Cu. The first metal layer 165a' and the third metal layer 165c' may be made of the same material, and the first metal layer 165a' and the second metal layer 165b' may be made of different materials. For example, the first metal layer 165a' and the third metal layer 165c' may be made of Ti, and the second metal layer 165b' may be made of Al.

A thickness (e.g., a thickness in the third direction D3) of the first metal layer 165a' may be smaller than that of the second metal layer 165b'. Further, a thickness of the third metal layer 165c' may be smaller than that of the second metal layer 165b'. The thickness of the third metal layer 165c' may be substantially the same as (or equal to) that of the first metal layer 165a'.

A width (e.g., a width in the first direction D1) of the first metal layer 165a' may be greater than that of the upper surface or the lower surface of the second metal layer 165b'. Further, a width of the third metal layer 165c' may be greater than that of the upper surface or the lower surface of the second metal layer 165b'. The width of the upper surface of the second metal layer 165b' may be smaller than that of the lower surface thereof.

The first metal layer 165a' may expose a first side surface 135a and a second side surface 135b of the auxiliary electrode 135. The first side surface 135a and the second side surface 135b of the auxiliary electrode 135 may overlap the third metal layer 165c' in the thickness direction (e.g., the third direction D3), and are thus covered by the third metal layer 165c' in the thickness direction. Accordingly, even when the organic layer 143 or a light emitting layer 141 is formed over a first base 101, the organic layer 143 or the light emitting layer 141 is not disposed on the first side surface 135a and the second side surface 135b of the auxiliary electrode 135. Consequently, it is possible to secure contacts between the first and second side surfaces 135a and 135b of the auxiliary electrode 135 and a common electrode 150. Accordingly, as described above, a voltage drop due to a reduction in thickness of the common electrode 150 may be minimized or reduced.

Further, an end portion of the third metal layer 165c' may protrude more than an end portion of the upper surface of the second metal layer 165b'. A side surface of the second metal layer 165b' may be at least partially covered by the third metal layer 165c'. Accordingly, the organic layer 143 may be disposed on the upper surface of the third metal layer 165c' and may not be disposed on the side surface of the second metal layer 165b'. That is, the side surface of the second metal layer 165b' may not be covered by the organic layer 143 but may be exposed. On the other hand, the common electrode 150 having higher step coverage than that of the organic layer 143 may also be disposed on the side surface of the second metal layer 165b'. That is, the common electrode 150 may be in direct contact with the side surface of the second metal layer 165b'. Accordingly, the side surface of the second metal layer 165b' may serve as an electrode substantially the same as the auxiliary electrode 135. That is, the common electrode 150 may be electrically connected to a compensation electrode 123 through the side surface of the second metal layer 165b' and the auxiliary electrode 135. Consequently, as described above, a voltage drop due to a reduction in thickness of the common electrode 150 may be prevented more effectively, or the likelihood thereof may be reduced.

Further, when a side surface of the third metal layer 165c' protrudes further than a side surface of the first metal layer 165a', the organic layer 143 may not be disposed on the side surface of the first metal layer 165a', either. That is, the side surface of the first metal layer 165a' may be in direct contact with the common electrode 150. As such, the side surface of the first metal layer 165a' may serve as an electrode substantially the same as the auxiliary electrode 135. Consequently, as described above, a voltage drop due to a reduction in thickness of the common electrode 150 may be prevented more effectively, or the likelihood thereof may be reduced.

Figure 11:
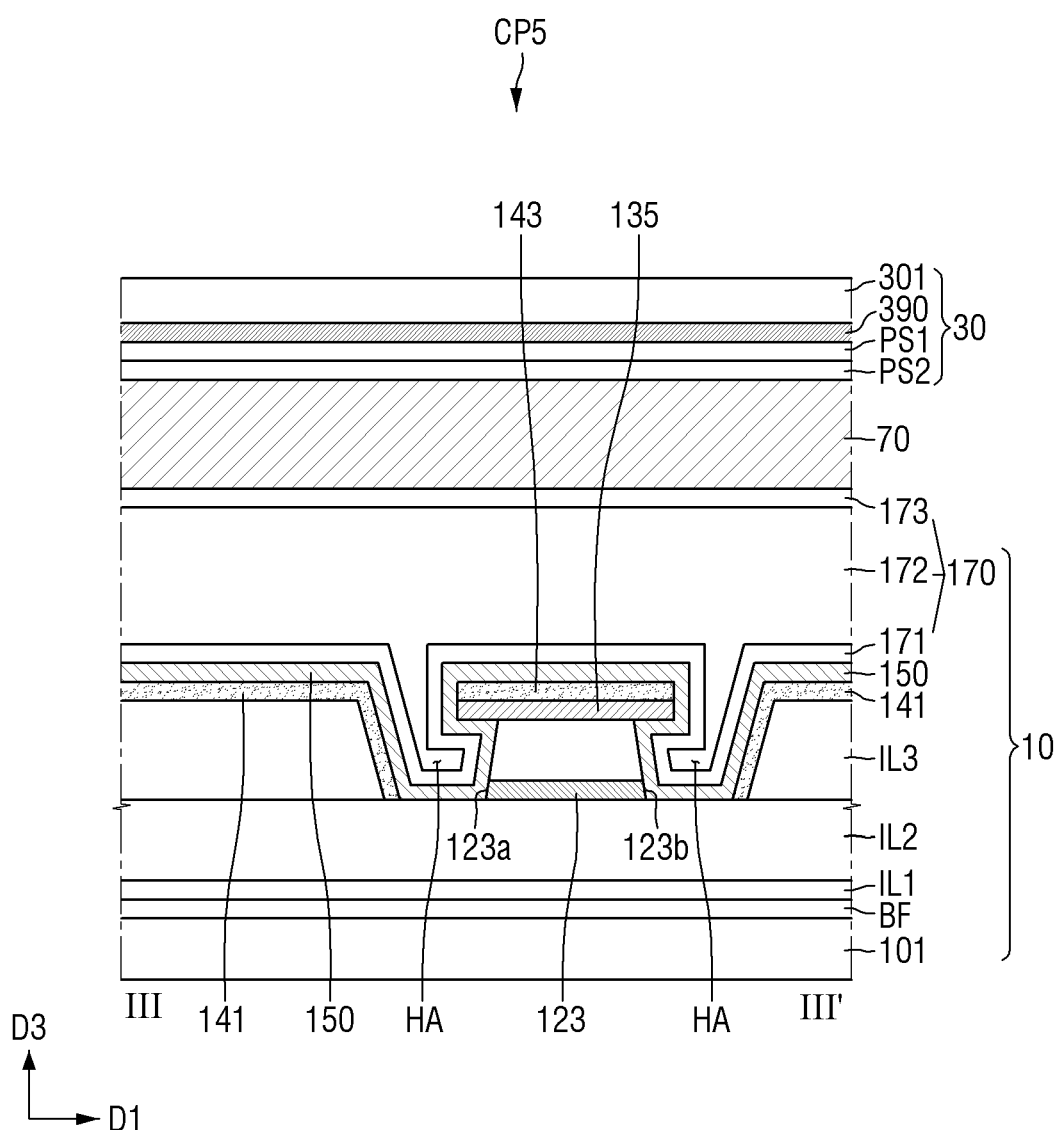
FIG. 11 is a cross-sectional view illustrating a compensation part according to an example embodiment of the present disclosure.

FIG. 11 is a cross-sectional view illustrating a compensation part according to yet another embodiment of the present disclosure.

Referring to FIG. 11, a compensation part CP5 according to the present embodiment is different from that according to according to the embodiment of FIGS. 1-7 in that a third insulating layer IL3 includes hole areas HA, and a compensation electrode 123 is in contact with a common electrode 150 in the hole areas HA.

Specifically, the third insulating layer IL3 may include the hole areas HA passing therethrough.

An organic layer 143 may be spaced apart from a light emitting layer 141 due to the hole areas HA. The organic layer 143 may be partially disposed on an auxiliary electrode 135. The common electrode 150 having relatively high step coverage may be continuously disposed on one surface of each of the hole areas HA.

The hole areas HA may be formed at both sides of the compensation electrode 123 along the first direction D1 (e.g., may be formed at a first side of the compensation electrode 123 and a second side of the compensation electrode 123). The hole area HA disposed on the first side of the compensation electrode 123 may expose a first side surface 123a of the compensation electrode 123, and the hole area HA disposed on the second side of the compensation electrode 123 may expose a second side surface 123b of the compensation electrode 123.

The first side surface 123a and the second side surface 123b of the compensation electrode 123 may overlap the auxiliary electrode 135 in the thickness direction (e.g., the third direction D3), thereby being covered by the auxiliary electrode 135. Accordingly, even when the organic layer 143 or the light emitting layer 141 is formed over a first base 101, the organic layer 143 or the light emitting layer 141 is not disposed on the first side surface 123a and the second side surface 123b of the compensation electrode 123 in the hole areas HA. Consequently, it is possible to secure contacts between the first and second side surfaces 123a and 123b of the compensation electrode 123 and a common electrode 150. Accordingly, as described above, a voltage drop due to a reduction in thickness of the common electrode 150 may be minimized or reduced.

The hole areas HA may be formed by etching the third insulating layer IL3 using the auxiliary electrode 135 as a mask. The hole areas HA may have a trapezoidal shape in which diameters (or widths) of the hole areas HA decrease toward the first base 101, but the present disclosure is not limited thereto.

Meanwhile, the hole areas HA, which are formed using the auxiliary electrode 135 formed of a first electrode 130 as a mask, have been illustrated in FIG. 11, but the present disclosure is not limited thereto. That is, a separate hard mask layer may be included instead of the auxiliary electrode 135. The auxiliary electrode 135 may then be omitted.

Hereinafter, a method of manufacturing a display device according to an embodiment is described. Among display devices according to various embodiments, an example of a method of manufacturing the display device of FIGS. 1-7 is described. Components that are substantially the same as those in FIGS. 1-7 are denoted by the same reference numerals and detailed reference numerals may be omitted.

FIGS. 12-18 are cross-sectional views illustrating each process of a method of manufacturing a display device according to an embodiment of the present disclosure.

Figure 12:
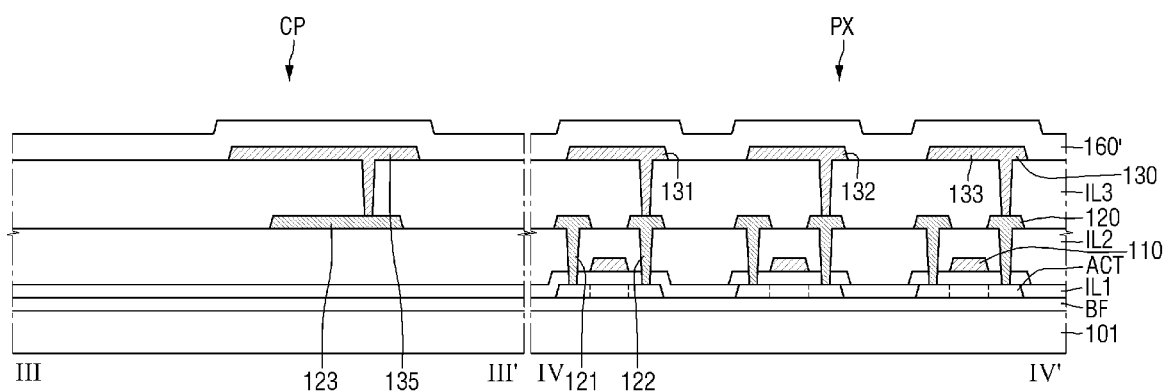
FIGS. 12-18 are cross-sectional views illustrating each process of a method of manufacturing a display device according to an example embodiment of the present disclosure.

Referring to FIG. 12, an inorganic layer 160' is formed first on a first base 101, on which the above-described first, second, and third conductive layers 110, 120, and 130, the above-described first, second, and third insulating layers IL1, IL2, and IL3, and the first electrode 130 are formed. Vacuum deposition or sputtering may be used in the formation of the inorganic layer 160', but the present disclosure is not limited thereto. The inorganic layer 160' may be formed using a composition for an inorganic layer containing $SiO_x$, $SiN_x$, or $SiON_x$.

Figure 13:
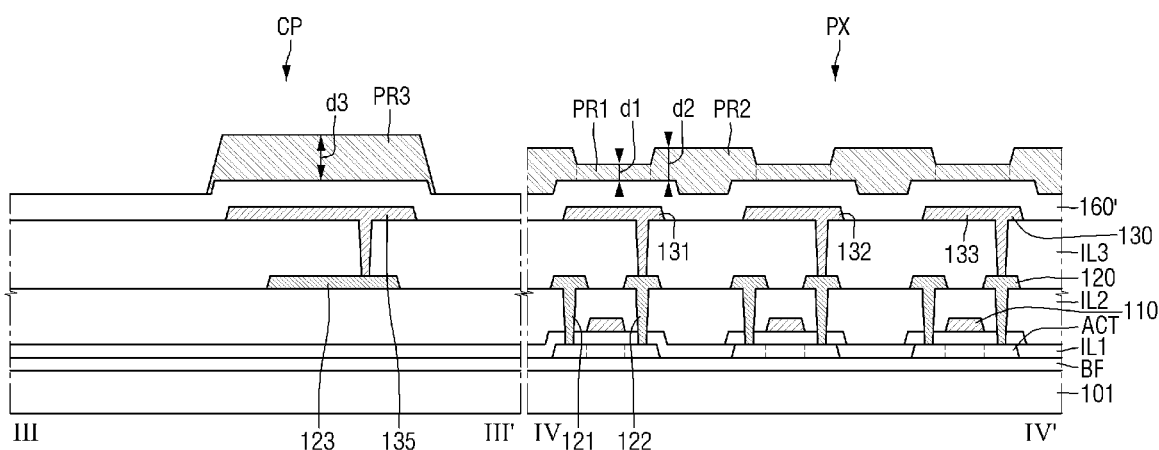

Subsequently, referring to FIG. 13, a first photoresist PR1, a second photoresist PR2, and a third photoresist PR3 are formed on the inorganic layer 160'.

The first photoresist PR1 may be formed in the light emitting area of the pixel PX. That is, the first photoresist PR1 may be formed to overlap the first, second, and third pixel electrodes 131, 132, and 133.

The second photoresist PR2 may be formed in the non-light emitting area of the pixel PX. The second photoresist PR2 may be disposed to partially overlap side surfaces of the first, second, and third pixel electrodes 131, 132, and 133. The second photoresist PR2 may be formed to be relatively thick so as to form the above-described pixel defining layer 161. A second thickness d2 of the second photoresist PR2 may be greater than a first thickness d1 of the first photoresist PR1.

The third photoresist PR3 may be formed in the compensation part CP. The third photoresist PR3 may be formed to overlap the auxiliary electrode 135 of the compensation part CP. The third photoresist PR3 may be formed to be relatively thick so as to form the above-described reverse-tapered structure of the partition wall 163. A third thickness d3 of the third photoresist PR3 may be greater than the first thickness d1 of the first photoresist PR1.

Figure 14:
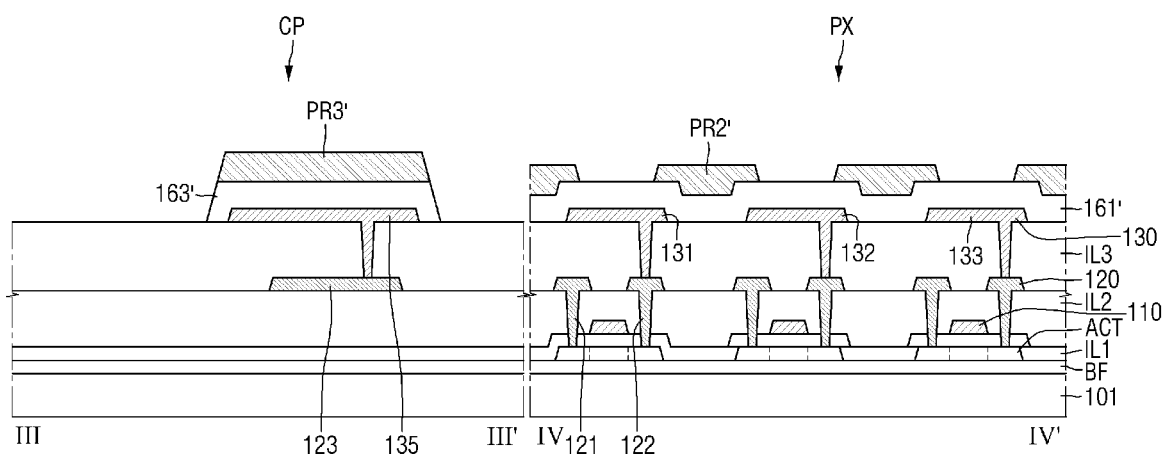

Subsequently, referring to FIG. 14, the first, second, and third photoresists PR1, PR2, and PR3 are etched. The first photoresist PR1 of the pixel PX is removed by etching so that an upper surface of a first inorganic layer 161' may be exposed. During the etching of the first photoresist PR1, a portion of the second photoresist PR2 is etched so that a thickness of a second photoresist PR2' may be decreased.

During the etching of the photoresists PR1 and PR2 of the pixel PX, the third photoresist PR3 and the inorganic layer 160' of the compensation part CP are etched so that a thickness of a third photoresist PR3' may be decreased. Further, the inorganic layer 160' that is exposed due to the third photoresist PR3 may be removed, and an upper surface of the third insulating layer IL3 may be exposed. A second inorganic layer 163' coated with the third photoresist PR3' may be protected so as not to be etched.

Figure 15:
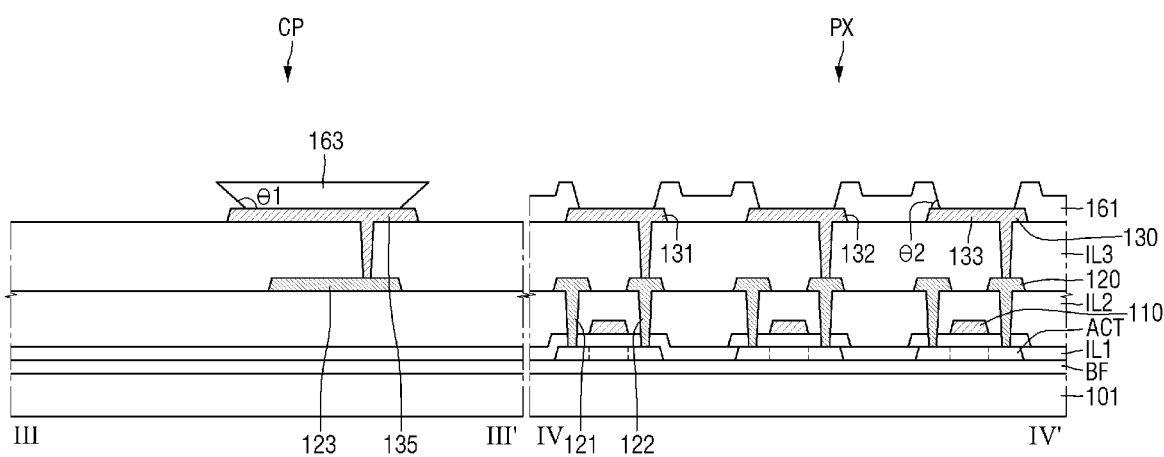

Referring to FIG. 15, the etching is continued to completely remove the photoresists PR2' and PR3' on the inorganic layers 161' and 163'. The second photoresist PR2' and the first inorganic layer 161' that are exposed due to the second photoresist PR2' are removed to form the pixel defining layer 161, which includes the openings that expose the first, second, and third pixel electrodes 131, 132, and 133.

During the etching of the second photoresist PR2' and the first inorganic layer 161' of the pixel PX, the third photoresist PR3' and the second inorganic layer 163' of the compensation part CP may be etched. An over-etch may be induced with respect to the second inorganic layer 163' to form the partition wall 163 having the reverse-tapered structure. The first tapered angle θ1 between the partition wall 163 and the auxiliary electrode 135 may be adjusted in a range of between about 100° to about 150°. Alternatively, the first tapered angle θ1 may be adjusted in a range of between about 110° to about 130°, but the present disclosure is not limited thereto.

Figure 16:
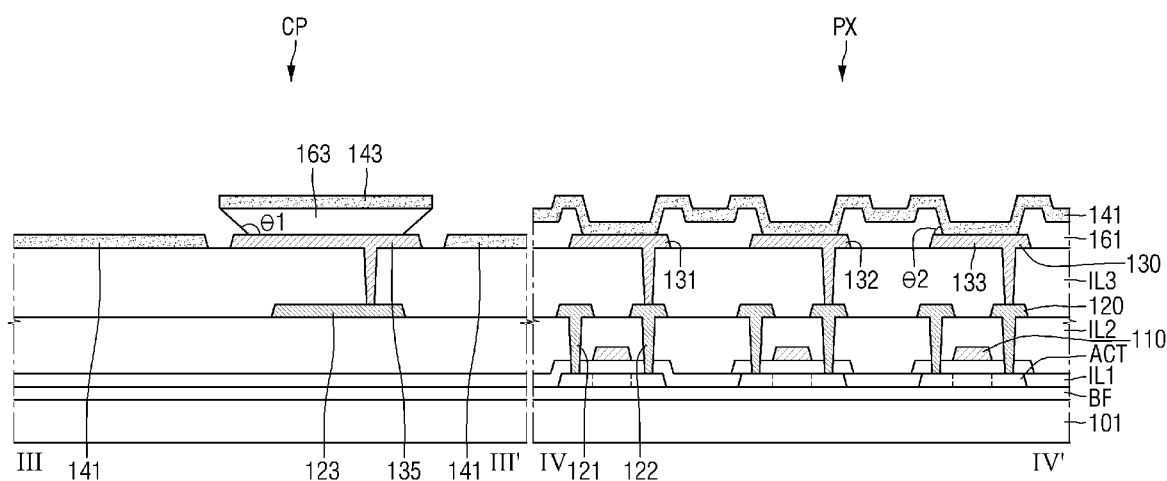

Subsequently, referring to FIG. 16, the organic layer 143 and the light emitting layer 141 are formed. The organic layer 143 may be simultaneously (or concurrently) formed with the light emitting layer 141. Further, the organic layer 143 and the light emitting layer 141 may be formed of the same material.

The organic layer 143 and the light emitting layer 141 may be formed by depositing a material for an organic light emitting layer on an entire surface of the first base 101. As described above, because the material for an organic light emitting layer has low step coverage, when the material for an organic light emitting layer is deposited, the organic layer 143 or the light emitting layer 141 may be formed only in some areas. That is, the light emitting layer 141 is formed on the first, second, and third pixel electrodes 131, 132, and 133 of the pixel PX and the pixel defining layer 161, and the organic layer 143 is formed on the upper surface of the partition wall 163 of the compensation part CP and formed above some areas of the third insulating layer IL3, and is not formed on the side surface of the partition wall 163 and the side surface of the auxiliary electrode 135.

Figure 17:
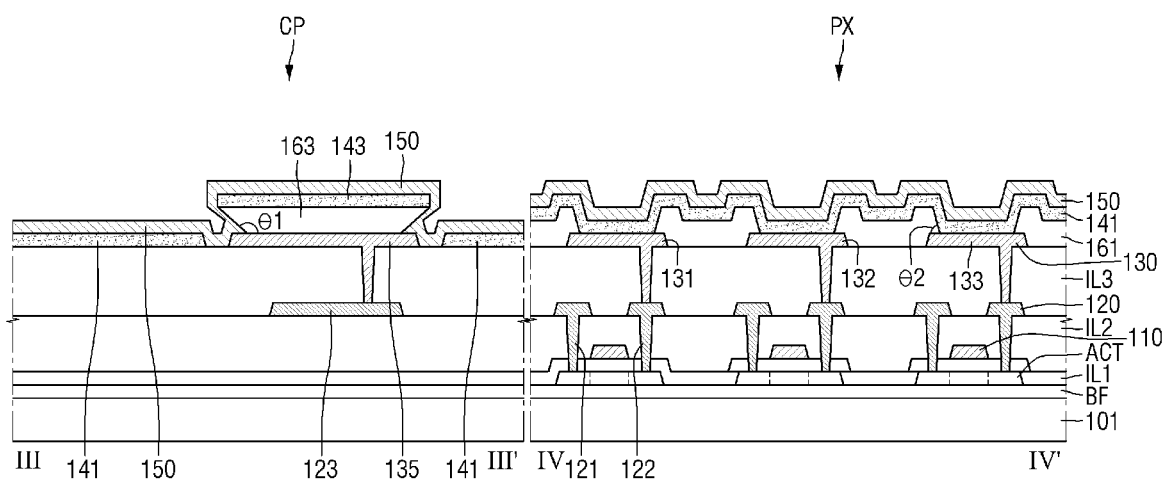

Subsequently, referring to FIG. 17, the common electrode 150 is formed on the organic layer 143 and the light emitting layer 141. The common electrode 150 may be continuously formed by depositing a material for a common electrode on the organic layer 143 and the light emitting layer 141. The material for a common electrode may include a material having a low work function for easy electron injection, e.g., Li, Ca, LiF/Ca, LiF/Al, Al, Mg, Ag, Pt, Pd, Ni, Au, Nd, Ir, Cr, BaF, Ba, or a compound or a mixture thereof (e.g., a mixture of Ag and Mg). Further, the material for a common electrode may further include a transparent conductive oxide such as ITO, IZO, ITZO, ZnO, tin oxide, or the like.

As described above, because the common electrode 150 has higher step coverage than the organic layer 143 and the light emitting layer 141, even when the partition wall 163 is formed in the reverse-tapered structure, the common electrode 150 may be deposited not only on the side surface of the partition wall 163, but also on one surface of each structure under the partition wall 163. Accordingly, because the common electrode 150 may be in contact with the auxiliary electrode 135, a separate contact hole forming process for connecting the common electrode 150 to the auxiliary electrode 135 may be omitted. That is, it is possible to minimize or reduce a voltage drop of the display device 1 and, at the same time, secure economic feasibility of a process.

Figure 18:
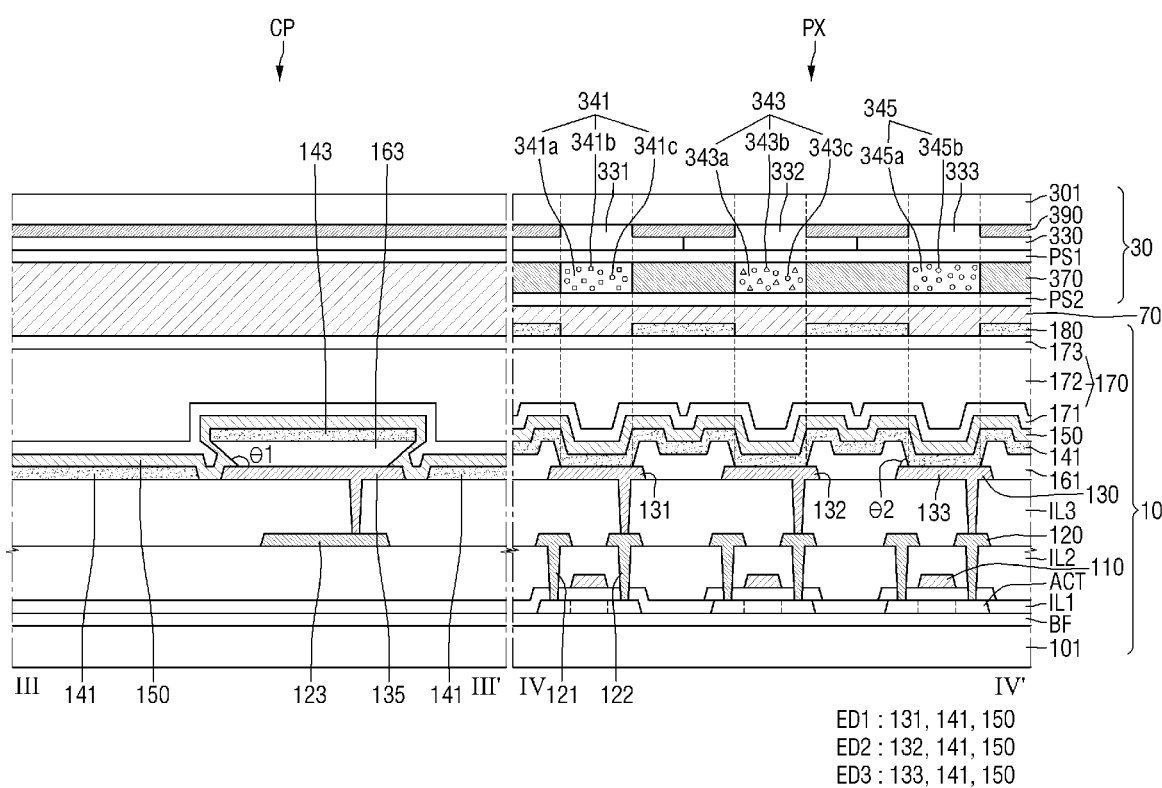

Subsequently, referring to FIG. 18, the thin film encapsulation layer 170 is formed on the common electrode 150 to complete the first substrate 10. The filling layer 70 is interposed between the completed first substrate 10 and the second substrate 30 such that the display device 1 shown in FIGS. 1-7 may be completed.

According to the manufacturing method of the display device 1 according to the above-described embodiment, the compensation electrode 123 of the compensation part CP may be electrically connected to the common electrode 150 to minimize or reduce the voltage drop of the display device 1. Accordingly, even when the thickness of the common electrode 150 is formed to be relatively small (or thin), or the display device 1 is implemented as a large-area display device, it is possible to minimize, prevent, or reduce degradation in brightness of the display device 1.

Further, the partition wall 163 is formed in a reverse-tapered structure such that a separate contact hole forming process for connecting the common electrode 150 to the auxiliary electrode 135 may be omitted. That is, it is possible to minimize or reduce the voltage drop of the display device 1 and, at the same time, secure the economic feasibility of a process.

In accordance with a display device and a method of manufacturing the same according to the embodiments, a common electrode of a pixel is electrically connected to a compensation electrode of a compensation part such that a voltage drop of the display device can be minimized or reduced. Accordingly, even when the common electrode is formed with a thin thickness or the display device is implemented as a large-area display device, it is possible to minimize, prevent, or reduce degradation in brightness of the display device.

Further, a partition wall is formed in a reverse-tapered structure such that a separate contact hole forming process for connecting the common electrode to an auxiliary electrode can be omitted. That is, it is possible to minimize or reduce the voltage drop of the display device and, at the same time, secure economic feasibility of a process.

The effects according to the embodiments are not limited by the contents exemplified above, and more various effects are included in embodiments of the present disclosure.

In concluding the detailed description, those skilled in the art will appreciate that many variations and modifications can be made to the example embodiments without substantially departing from the principles of the present disclosure. Therefore, the disclosed example embodiments of the disclosure are used in a generic and descriptive sense only and not for purposes of limitation.

What is claimed is:

1. A display device comprising:
a first base;
a pixel electrode on the first base;
a pixel defining layer having an opening that at least partially exposes the pixel electrode;
a light emitting layer on the pixel electrode;
an auxiliary electrode at a same layer as the pixel electrode;
a partition wall on the auxiliary electrode and at least partially exposing a side surface of the auxiliary electrode;
an organic layer on the partition wall; and
a common electrode continuously arranged on the light emitting layer and the organic layer,
wherein a side surface of the partition wall has a reverse-tapered shape, and
wherein the common electrode directly contacts the side surface of the auxiliary electrode.

2. The display device of claim 1, wherein a first tapered angle between the side surface of the partition wall and an upper surface of the auxiliary electrode is greater than a second tapered angle between the pixel defining layer and an upper surface of the pixel electrode.

3. The display device of claim 2, wherein the side surface of the partition wall contacts the common electrode.

4. The display device of claim 1, further comprising a compensation electrode electrically connected to the auxiliary electrode.

5. The display device of claim 4, further comprising a source electrode or a drain electrode located between the first base and the pixel electrode,
wherein the pixel electrode is electrically connected to the source electrode or the drain electrode, and
wherein the compensation electrode is at a same layer as the source electrode or the drain electrode.

6. The display device of claim 4, wherein the common electrode is electrically connected to the compensation electrode.

7. The display device of claim 1, wherein a lower surface of the partition wall contacts the auxiliary electrode, and an upper surface of the partition wall contacts the organic layer.

8. The display device of claim 1, wherein the partition wall and the pixel defining layer comprise a same material.

9. The display device of claim 8, wherein the partition wall and the pixel defining layer comprise SiNx, SiOx, or SiON.

10. The display device of claim 8, wherein the partition wall comprises a conductive material.

11. The display device of claim 1, wherein a lower surface of the organic layer contacts the partition wall, and an upper surface of the organic layer contacts the common electrode.

12. The display device of claim 11, wherein the organic layer and the light emitting layer comprise a same material.

13. The display device of claim 12, wherein the organic layer is spaced apart from the light emitting layer.

14. The display device of claim 1, further comprising a wavelength conversion pattern and a light transmission pattern on the common electrode, and
  wherein the wavelength conversion pattern or the light transmission pattern overlaps the opening of the pixel defining layer in a thickness direction.

15. A display device comprising:
  a first base;
  a pixel electrode on the first base;
  a pixel defining layer having an opening that at least partially exposes the pixel electrode;
  a light emitting layer on the pixel electrode;
  an auxiliary electrode at a same layer as the pixel electrode;
  a conductive partition wall on the auxiliary electrode and comprising a first metal layer on the auxiliary electrode and a second metal layer on the first metal layer;
  an organic layer on the conductive partition wall; and
  a common electrode continuously arranged on the light emitting layer and the organic layer,
  wherein an end portion of the second metal layer protrudes further than an end portion of an upper surface of the first metal layer, and
  wherein the common electrode directly contacts a side surface of the first metal layer.

16. The display device of claim 15, wherein the auxiliary electrode is electrically connected to the common electrode.

17. The display device of claim 15, wherein a lower surface of the first metal layer contacts the auxiliary electrode, and the upper surface of the first metal layer contacts the second metal layer.

18. The display device of claim 17, wherein a width of the lower surface of the first metal layer in a first direction is greater than a width of the upper surface of the first metal layer in the first direction.

19. The display device of claim 17, wherein a thickness of the first metal layer in a third direction is greater than a thickness of the second metal layer in the third direction.

* * * * *